US011977970B2

(12) United States Patent
Friedman et al.

(10) Patent No.: US 11,977,970 B2
(45) Date of Patent: May 7, 2024

(54) SPINTRONIC COMPUTING ARCHITECTURE AND METHOD

(71) Applicant: Board of Regents, The University of Texas System, Austin, TX (US)

(72) Inventors: Joseph S. Friedman, Dallas, TX (US); Wesley H. Brigner, Frisco, TX (US); Naimul Hassan, Dallas, TX (US); Xuan Hu, Plano, TX (US); Alvaro Velasquez, West Palm Beach, FL (US)

(73) Assignee: Board of Regents, The University of Texas System, Austin, TX (US)

( * ) Notice: Subject to any disclaimer, the term of this patent is extended or adjusted under 35 U.S.C. 154(b) by 634 days.

(21) Appl. No.: 17/211,722

(22) Filed: Mar. 24, 2021

(65) Prior Publication Data

US 2021/0232903 A1 Jul. 29, 2021

Related U.S. Application Data

(63) Continuation-in-part of application No. 16/775,876, filed on Jan. 29, 2020, now Pat. No. 11,514,301.
(Continued)

(51) Int. Cl.
*G06N 3/063* (2023.01)
*G06N 3/084* (2023.01)
*H10N 50/10* (2023.01)
*H10N 50/80* (2023.01)
*H10N 70/20* (2023.01)

(52) U.S. Cl.
CPC ............. *G06N 3/063* (2013.01); *G06N 3/084* (2013.01); *H10N 50/10* (2023.02); *H10N 50/80* (2023.02); *H10N 70/20* (2023.02)

(58) Field of Classification Search
None
See application file for complete search history.

(56) References Cited

U.S. PATENT DOCUMENTS

| 2017/0330070 A1 | 11/2017 | Sengupta et al. |
| 2018/0358105 A1 | 12/2018 | Sasaki |

(Continued)

OTHER PUBLICATIONS

Notice of Allowance, dated Jul. 27, 2022, regarding U.S. Appl. No. 16/775,876, 9 pages.
(Continued)

*Primary Examiner* — Benjamin P Sandvik
(74) *Attorney, Agent, or Firm* — Yee & Associates, P.C.

(57) ABSTRACT

The present disclosure provides a domain wall magnetic tunnel junction device. Integration of input spikes pushes a domain wall within a ferromagnetic track toward a magnetic tunnel junction (MTJ). An energy gradient within the track pushes the domain wall away from the MTJ by leaking accumulated energy from the input spikes. If the integrated input spikes exceed the energy leak of the gradient within a specified time period, the domain wall reaches the MTJ and reverses its resistance, producing an output spike. The leaking energy gradient can be created by a magnetic field, a trapezoidal shape of the ferromagnetic track, or nonuniform material properties in the ferromagnetic track. A feedback and feedforward crossbar configuration is disclosed that provides for a neuromorphic computing system suitable for unsupervised learning.

21 Claims, 27 Drawing Sheets

Related U.S. Application Data

(60) Provisional application No. 62/993,991, filed on Mar. 24, 2020, provisional application No. 62/798,222, filed on Jan. 29, 2019.

(56) References Cited

U.S. PATENT DOCUMENTS

| | | |
|---|---|---|
| 2019/0035446 A1 | 1/2019 | Shibata et al. |
| 2019/0251427 A1 | 8/2019 | Park et al. |
| 2019/0355895 A1* | 11/2019 | Song ................ H10N 50/80 |
| 2020/0242462 A1 | 7/2020 | Friedman et al. |
| 2021/0119114 A1 | 4/2021 | Fukami et al. |
| 2021/0383853 A1 | 12/2021 | Shibata et al. |

OTHER PUBLICATIONS

Sengupta et al., "Proposal for an All-Spin Artificial Neural Network: Emulating Neural and Synaptic Functionalities Through Domain Wall Motion in Ferromagnets," IEEE Transactions on Biomedical Circuits and Systems, vol. 10, No. 6, Dec. 2016, 9 pages.

Office Action, dated Apr. 13, 2022, regarding U.S. Appl. No. 16/775,876, 6 pages.

Final Office Action, dated Jun. 16, 2022, regarding U.S. Appl. No. 16/775,876, 7 pages.

* cited by examiner

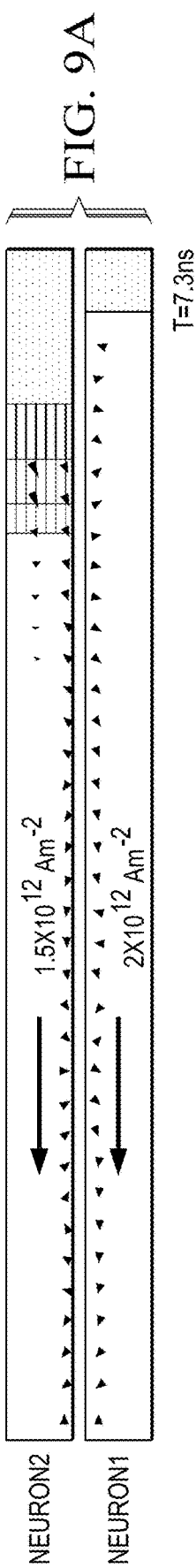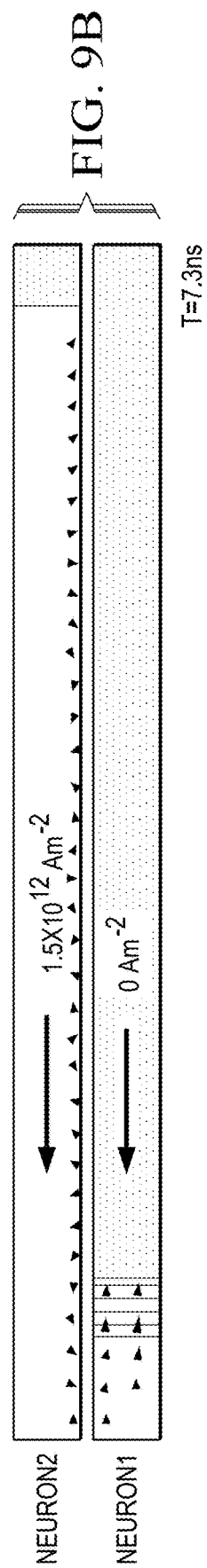

SPINTRONIC COMPUTING ARCHITECTURE AND METHOD

RELATED APPLICATIONS

This application in a continuation-in-part of U.S. application Ser. No. 16/775,876, entitled "Magnetic Domain Wall Drift for an Artificial Leaky Integrate-and-Fire Neuron," filed Jan. 29, 2020, which claims priority to U.S. Provisional Application No. 62/798,222, filed Jan. 29, 2019, the entirety of which are hereby incorporated by reference.

This application also claims priority to U.S. Provisional Application No. 62/993,991, filed Mar. 24, 2020, the entirety of which is hereby incorporated by reference.

STATEMENT OF GOVERNMENT INTEREST

This invention was made with Government support under contract number 1910800 awarded by the National Science Foundation. The Government has certain rights in the invention.

BACKGROUND INFORMATION

Field

The present disclosure relates generally to neural networks, and more specifically to hardware realizations of neuromorphic crossbar arrays suitable for on-chip competitive learning.

Background

Whereas conventional computing machines efficiently solve staggeringly difficult deterministic problems, the human brain is far superior for processing unstructured real world information. Furthermore, the accomplishment of some tasks, such as those related to pattern recognition, can be achieved by the human brain with orders-of-magnitude less energy than with a computer. Though human understanding of our own mental processes is far from complete, neuroscience researchers have identified neurons and synapses as core elements of our neural information processing systems: the neurons emit electrical signals based on input electrical signals, while the synapses provide electrical connectivity between the neurons. These electrical interactions are generally responses to external stimuli and result in changes to the physical state of a person through modifications of memory, hormonal changes, and physical actions (e.g., talking, walking). It is generally believed that these external stimuli cause short- and long-term changes to the synapses, temporarily or permanently modifying the connectivity between neurons. By modifying the connectivity between neurons, the brain responds to external stimuli by altering the circuit through which external stimuli cause changes in the human's physical state. Simultaneously, the brain also responds to these external stimuli by taking the actions prescribed by the circuit.

In order to realize an efficient artificial neuromorphic information processing system, the system should be designed specifically to emulate the electrical interactions present within a biological system. While much previous work has involved software simulation of neurons and synapses with general purpose computing hardware, the energy consumed by these systems exceeds that of the brain by orders of magnitude. Efforts are therefore underway to develop a neuromorphic hardware system, with exciting recent results achieved with silicon transistor circuits that emulate the behavior of both neurons and synapses. However, as silicon transistors inherently provide volatile binary switching that does not readily map to neuron and synapse behavior, it is expected that the use of nanodevices that emulate neuron and synapse behavior will drastically increase the efficiency of neuromorphic computing systems. The non-volatility provided by spintronic devices, as well as memristors, is particularly promising for the development of nanodevices that intrinsically emulate neurological behavior.

While numerous two-terminal nanodevices—particularly memristors—have been shown to modulate the resistance in a non-volatile manner analogous to the behavior of biological synapses, the relative complexity of neuron functionality has impeded the identification of analogous behavior in nanodevices. In particular, neuroscientific studies suggest that biological neurons integrate input signals over time and fire once a threshold value has been reached. In the absence of a strong input, the neurons leak over time and eventually reset to a relaxed state. Furthermore, neighboring neurons interact in an inhibitory manner via a variety of species of connected inhibitory interneurons. These interneurons utilize neurotransmitter projections (i.e., γ-aminobutyric acid (GABA)) to continuously reduce the effectiveness of neighbors by altering the synaptic efficiency of contributing synapses or directly preventing depolarization.

SUMMARY

An embodiment of the present disclosure provides a domain wall magnetic tunnel junction device comprising a number of ferromagnetic tracks, wherein each ferromagnetic track has a first fixed magnetization region at a first end and a second fixed magnetization region at a second end, and wherein the second fixed magnetization region has a magnetic direction opposite to the first fixed magnetization region. A magnetic tunnel junction is located between the first and second ends of each ferromagnetic track, wherein each magnetic tunnel junction comprises a tunnel barrier on the ferromagnetic track and a fixed ferromagnet on top of the tunnel barrier. A magnetic field in communication with the ferromagnetic tracks produces an energy gradient that causes the domain wall to leak accumulated energy from integrated input spikes.

Another embodiment of the present disclosure provides a domain wall magnetic tunnel junction device comprising a number of ferromagnetic tracks, wherein each ferromagnetic track has a first fixed magnetization region at a first end and a second fixed magnetization region at a second end, and wherein the second fixed magnetization region has a magnetic direction opposite to the first fixed magnetization region, and wherein each ferromagnetic track is trapezoidal having a first width at the first end and a second width at the second opposite end, wherein the second width is longer than the first width. A magnetic tunnel junction is located between the first and second ends of each ferromagnetic track, wherein each magnetic tunnel junction comprises a tunnel barrier on the ferromagnetic track and a fixed ferromagnet on top of the tunnel barrier. The trapezoidal shape of the ferromagnetic track produces a domain wall gradient that leaks accumulated energy from integrated input spikes.

Another embodiment of the present disclosure provides a domain wall magnetic tunnel junction device comprising a number of ferromagnetic tracks, wherein each ferromagnetic track has a first fixed magnetization region at a first end and a second fixed magnetization region at a second end, and wherein the second fixed magnetization region has a magnetic direction opposite to the first fixed magnetization region, and wherein each ferromagnetic track has nonuniform material properties. A magnetic tunnel junction is located between the first and second ends of each ferromagnetic track, wherein each magnetic tunnel junction comprises a tunnel barrier on the ferromagnetic track and a fixed ferromagnet on top of the tunnel barrier. The nonuniform material properties of the ferromagnetic tracks produces a domain wall gradient that leaks accumulated energy from integrated input spikes.

Another embodiment of the present disclosure provides a method of controlling domain wall drift in a domain wall magnetic tunnel junction device comprising applying input current to the device, wherein the device comprises: a ferromagnetic track, wherein the ferromagnetic track has a first fixed magnetization region at a first end and a second fixed magnetization region at a second end, and wherein the second fixed magnetization region has a magnetic direction opposite to the first fixed magnetization region; and a magnetic tunnel junction between the first and second ends of the ferromagnetic track, wherein the magnetic tunnel junction comprises a tunnel barrier on the ferromagnetic track and a fixed ferromagnet on top of the tunnel barrier. Integrating the input current pushes a domain wall within the ferromagnetic track toward the second end, wherein magnetization within the ferromagnetic track is in opposite directions on opposite sides of the domain wall. A constant opposing force pushes the domain wall toward the first end of the ferromagnetic track. If integrating the input current exceeds the constant opposing force within a specified time period, the domain wall reaches a threshold causing the magnetic tunnel junction to change from an anti-parallel state to a parallel state, which produces an output firing spike from the device.

Another embodiment of the present disclosure provides a domain wall magnetic tunnel junction device. The device comprises a ferromagnetic domain wall track having a first fixed magnetization region at a first end and a second fixed magnetization region at a second end, wherein the second fixed magnetization region has a magnetic direction opposite to the first fixed magnetization region, and wherein the domain wall track comprises an energy gradient between the first and second ends. A magnetic tunnel junction is located between the first and second ends of the domain wall track, wherein the magnetic tunnel junction comprises a fixed ferromagnet, a tunnel barrier beneath the fixed ferromagnet, a free ferromagnet beneath the tunnel barrier, and an electrically insulated, magnetically coupled layer between the free ferromagnet and the ferromagnetic track, wherein the fixed ferromagnet is electrically isolate from the ferromagnetic track. An electric output terminal is coupled to the free ferromagnet.

Another embodiment of the present disclosure provides a neural network. The neural network comprises a first crossbar array of domain wall magnetic tunnel junction synapses and a first plurality of domain wall magnetic tunnel junction artificial neurons configured to receive first input signals from the first crossbar array of domain wall magnetic tunnel junction synapses. The neural network also comprises a second crossbar array of domain wall magnetic tunnel junction synapses configured to receive second input signals from the first plurality of domain wall magnetic tunnel junction artificial neurons. The second input signals comprise output signals from respective free ferromagnets in the first plurality of domain wall magnetic tunnel junction artificial neurons, wherein the free ferromagnets are electrically isolated from input terminals in the domain wall magnetic tunnel junction artificial neurons. A second plurality of domain wall magnetic tunnel junction artificial neurons is configured to receive third input signals from the second crossbar array of domain wall magnetic tunnel junction synapses.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

FIG. 6B depicts the relationship between DW velocity and current density;

FIG. 9A illustrates micromagnetic simulation snapshots of two z-axis-polarized ferromagnetic tracks in accordance with an illustrative embodiment;

FIG. 9B illustrates micromagnetic simulation snapshots of two z-axis-polarized ferromagnetic tracks in accordance with an illustrative embodiment;

DETAILED DESCRIPTION

Figure 1:
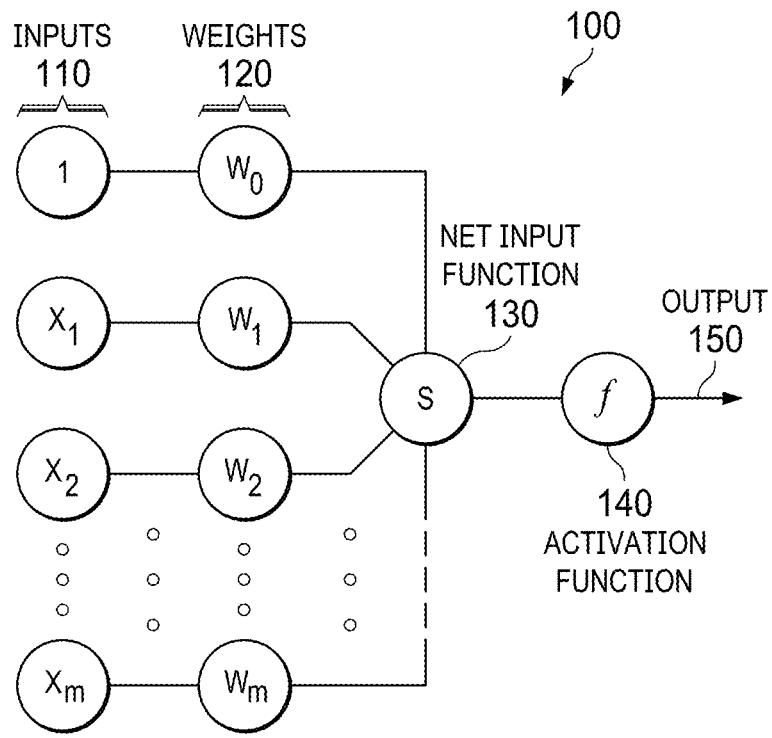
FIG. 1 is a diagram that illustrates a node in a neural network in which illustrative embodiments can be implemented.

The present disclosure recognizes and takes into account that as the nature of firing requires the interaction of external devices and therefore must be implemented in concert with an external circuit, the ideal artificial neuron should inherently perform leaking, integration, and lateral inhibition. Several spintronic neurons have been proposed, including spiking neurons that inherently perform integration. However, these neurons require complementary hardware to perform leaking and lateral inhibition. Furthermore, lateral inhibition has been demonstrated in spintronic neurons through the use of an additional crossbar row.

The present disclosure provides the first artificial neuron that inherently performs integrating, leaking, and lateral inhibition within a single nanodevice. This is achieved by adapting the experimentally-proven domain wall-magnetic tunnel junction (DW-MTJ) device, which has heretofore been applied to Boolean logic, artificial synapses, and artificial neurons that intrinsically provide neither leaking nor lateral inhibition. By adding a hard ferromagnet below the DWMTJ track to cause behavior analogous to leaking, a novel device is here demonstrated with micromagnetic simulation to intrinsically perform the leaking, integration, and lateral inhibition required by an artificial neuron. Similar to previous work, firing is achieved in concert with an external circuit when the MTJ resistance is switched by the propagation of a domain wall within the soft ferromagnetic track. The ferromagnetic tracks create stray fields that inhibit the motion of domain walls within the ferromagnetic tracks of adjacent neurons, thus inherently providing lateral inhibition. The efficacy of this approach within a large system is demonstrated with micromagnetic simulations of a winner-take-all (WTA) output neuron layer that achieves an accuracy of 94% for the well-known task of handwritten digit recognition.

The present disclosure also provides an alternative three-terminal magnetic tunnel junctions (3T-MTJ) neuron in which the fabrication is simplified by reducing the number of material layers: the leaking effect provided by the bottom ferromagnet is here provided instead by shape-based magnetic domain wall (DW) drift.

The present disclosure also provides an alternative 3T-MTJ neuron that simplifies fabrication by reducing the number of material layers. Instead of using an externally applied magnetic field, the leaking functionality is implemented using a magneto-crystalline anisotropy gradient.

Modern von Neumann computing systems are capable of efficiently solving staggeringly difficult problems when provided with a structured data set. However, the human brain outperforms computers when processing unstructured real-world information. In fact, the brain is capable of performing these tasks with many orders of magnitude less energy than is required by computers. This impressive computational efficiency is, according to neuroscientists, the result of complex interactions occurring between neurons and synapses.

Neurons are complex nerve cells which integrate electrical signals received via the cells' dendrites, originate electrical signals (spikes) in the soma (cell body), and propagate these signals forward into their axons to convey information. Meanwhile, synapses are the electrically conductive junctions between the axon of one neuron and the dendrite of another and permit communication between neurons.

FIG. 1 is a diagram that illustrates a node in a neural network in which illustrative embodiments can be implemented. Node 100 combines multiple inputs 110 from other nodes. Each input 110 is multiplied by a respective weight 120 that either amplifies or dampens that input, thereby assigning significance to each input for the task the algorithm is trying to learn. The weighted inputs are collected by a net input function 130 and then passed through an activation function 140 to determine the output 150. The connections between nodes are called edges. The respective weights of nodes and edges might change as learning proceeds, increasing or decreasing the weight of the respective signals at an edge. A node might only send a signal if the aggregate input signal exceeds a predefined threshold. Pairing adjustable weights with input features is how significance is assigned to those features with regard to how the network classifies and clusters input data.

Neural networks are often aggregated into layers, with different layers performing different kinds of transformations on their respective inputs. A node layer is a row of nodes that turn on or off as input is fed through the network. Signals travel from the first (input) layer to the last (output) layer, passing through any layers in between. Each layer's output acts as the next layer's input.

Figure 2:
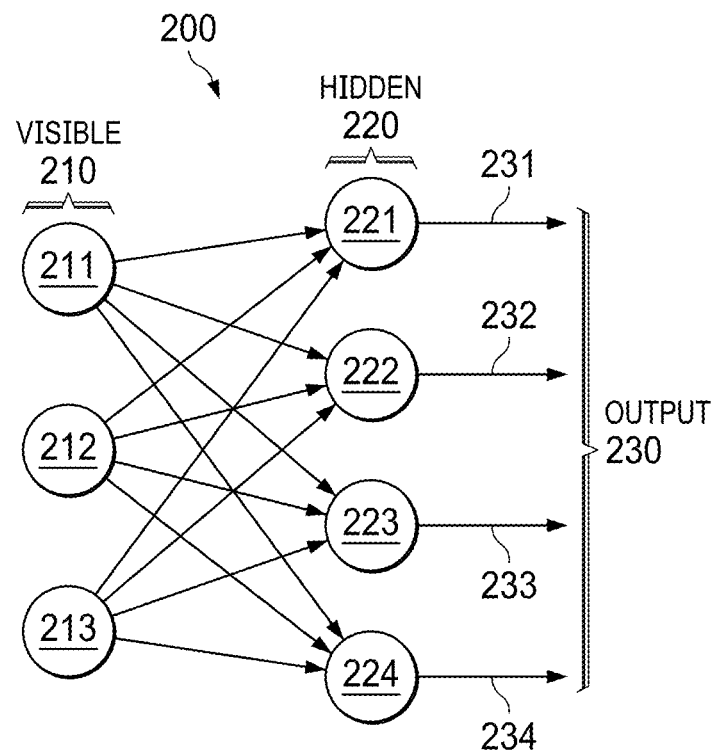
FIG. 2 is a diagram illustrating a neural network in which illustrative embodiments can be implemented.

FIG. 2 is a diagram illustrating a neural network in which illustrative embodiments can be implemented. As shown in FIG. 2, the nodes in the neural network 200 are divided into a layer of visible nodes 210 and a layer of hidden layer 220. The visible nodes 210 are those that receive information from the environment (i.e. a set of external training data). Each layer of visible nodes 210 takes a low-level feature from an item in the dataset and passes it to the hidden nodes in the next layer 220. When a node in the hidden layer 220 receives an input value x from visible nodes 210 it multiplies x by the weight assigned to that connection (edge) and adds it to a bias b. The result of these two operations is then fed into an activation function which produces the node's output.

In symmetric networks, each node in one layer is connected to every node in the next layer. For example, when node 221 receives input from all of the visible nodes 211-213 each x value from the separate nodes is multiplied by its respective weight, and all of the products are summed. The summed products are then added to the hidden layer bias, and the result is passed through the activation function to produce output 231. A similar process is repeated at hidden nodes 222-224 to produce respective outputs 232-234. In the case of a deeper neural network, the outputs 230 of hidden layer 220 serve as inputs to the next hidden layer.

Neural networks can be stacked to create deep networks. After training one neural net, the activities of its hidden nodes can be used as training data for a higher level, thereby allowing stacking of neural networks. Such stacking makes it possible to efficiently train several layers of hidden nodes. Examples of stacked networks include deep belief networks (DBN), deep Boltzmann machines (DBM), convolutional neural networks (CNN), recurrent neural networks (RNN), and spiking neural networks (SNN).

A primary objective in emulating neurobiological behavior within an artificial system is to efficiently replicate the neuron and synapse functionalities. This can be emulated with software running on standard computer hardware, though such approaches consume significantly greater energy than their biological counterparts. Energy improvements have therefore been demonstrated with dedicated hardware neural networks in which synapse and neuron functionalities are replicated with silicon transistors. However, the history-dependent nature of much synapse and neuron behavior inspire the use of non-volatile devices for increased efficiency.

To that end, non-volatile devices such as memristors and three-terminal magnetic tunnel junctions (3T-MTJs) have been used that thoroughly mimic the functionalities of biological synapses. However, replicating the complex integrative and temporal behaviors occurring within a neuron's cell body (soma) has been a greater challenge.

The development of a type of artificial neuron known as the "leaky integrate-and-fire" (LIF) neuron has been hindered by the need to implement the following functionalities:

1) Integration: Accumulation of a series of input spikes,
2) Leaking: Leaking of the accumulated signal over time when no input is provided, and
3) Firing: Emission of an output spike when the accumulated signal reaches a certain level after a series of integration and leaking.

The development of a hardware neural network requires artificial neurons and synapses that intrinsically function in a manner analogous to their biological analogs. In order to enable fabrication that is compatible with conventional processes, a synapse crossbar array connects the neurons. In order to emulate biological processes and implement the winner-take-all schemes involved in many machine learning techniques, these neurons must provide lateral inhibition, which is achieved here by adapting the DW-MTJ device.

The leaky integrate-and-fire (LIF) neuron has been well established as a primary area of interest for the development of an artificial neuron and is a modified version of the original integrate-and-fire circuit. It is based on the biological neuron, which operates in a network of other neurons, communicating via electrical spikes and chemical signals. In order to emulate this method of communication, an electrical LIF neuron sends spikes of voltage periodically, resulting from input currents arriving through synapses connected to other neurons in the network. In addition, there is also a refractory period, in which a neuron cannot fire for a certain amount of time after it has recently fired.

Figure 3:
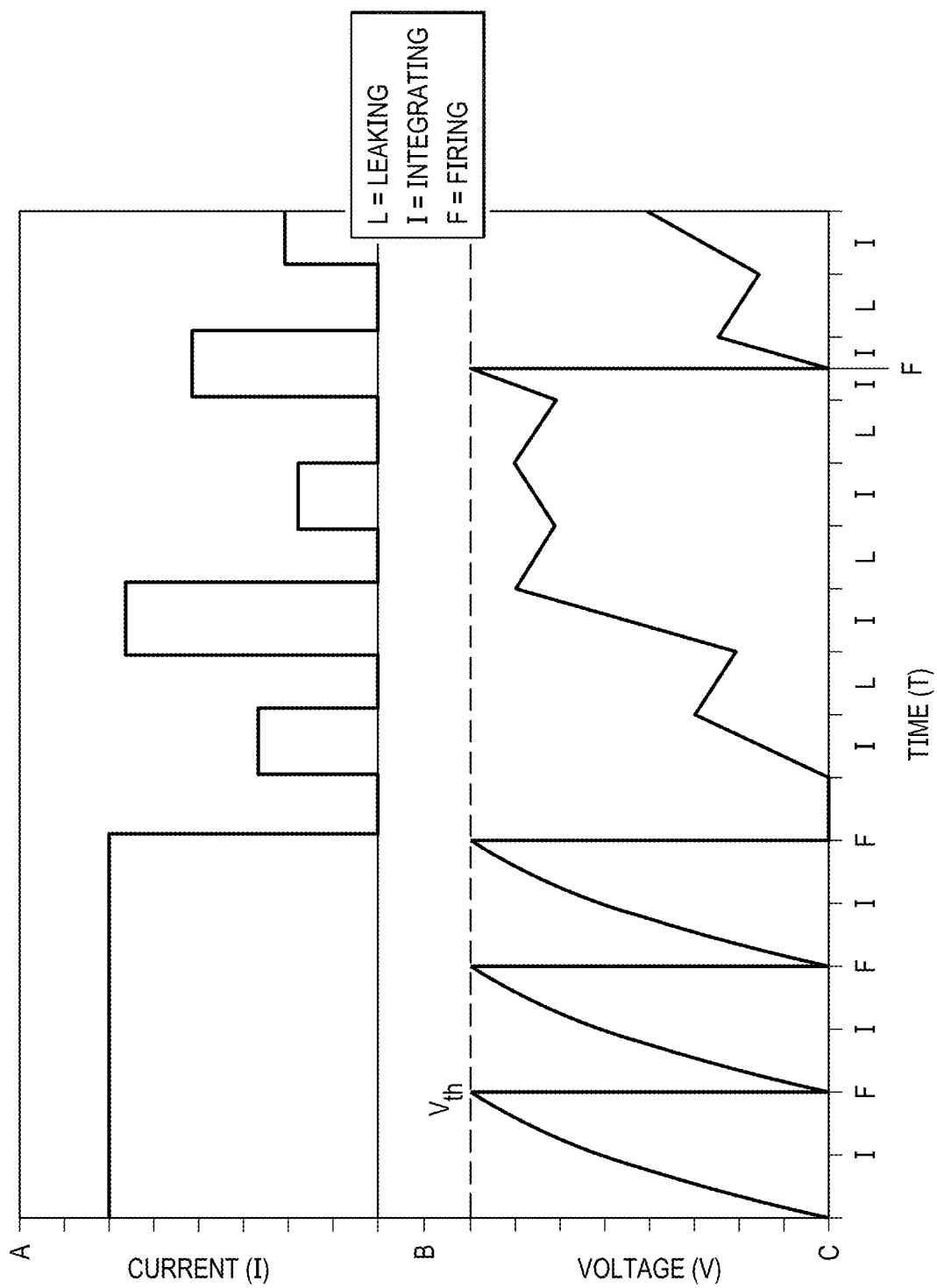
FIG. 3 illustrates the behavior of a LIF neuron in accordance with illustrative embodiments.

FIG. 3 illustrates the behavior of a LIF neuron in accordance with illustrative embodiments. An LIF neuron continually integrates the energy provided by an input current until a threshold is reached and the neuron fires, emitting this energy as a voltage spike that provides current to other neurons via synapse connections. By emitting this energy, the neuron is returned to a low energy state and continues to integrate input current until its next firing. Throughout this process, the energy stored in the neuron continually leaks such that if insufficient input current is provided, the neuron gradually reverts to a low energy state. This prevents the device from indefinitely retaining energy, which would not match the behavior of biological neurons.

The LIF behavior is illustrated in FIG. 3, where an input current continually modulates the energy (stored as voltage) within a LIF neuron. A large current is continually applied during the initial stage, resulting in repeated periods of integration interrupted by firing events. When no current is applied, the neuron leaks energy by decreasing the stored voltage. The input current shown in FIG. 3(a) causes leaking, integrating, and firing, as noted in FIG. 3(b). FIG. 3(c) shows the labels of the three phases that the leaky integrate-and-fire can go through when excited by the input current.

Figure 4:
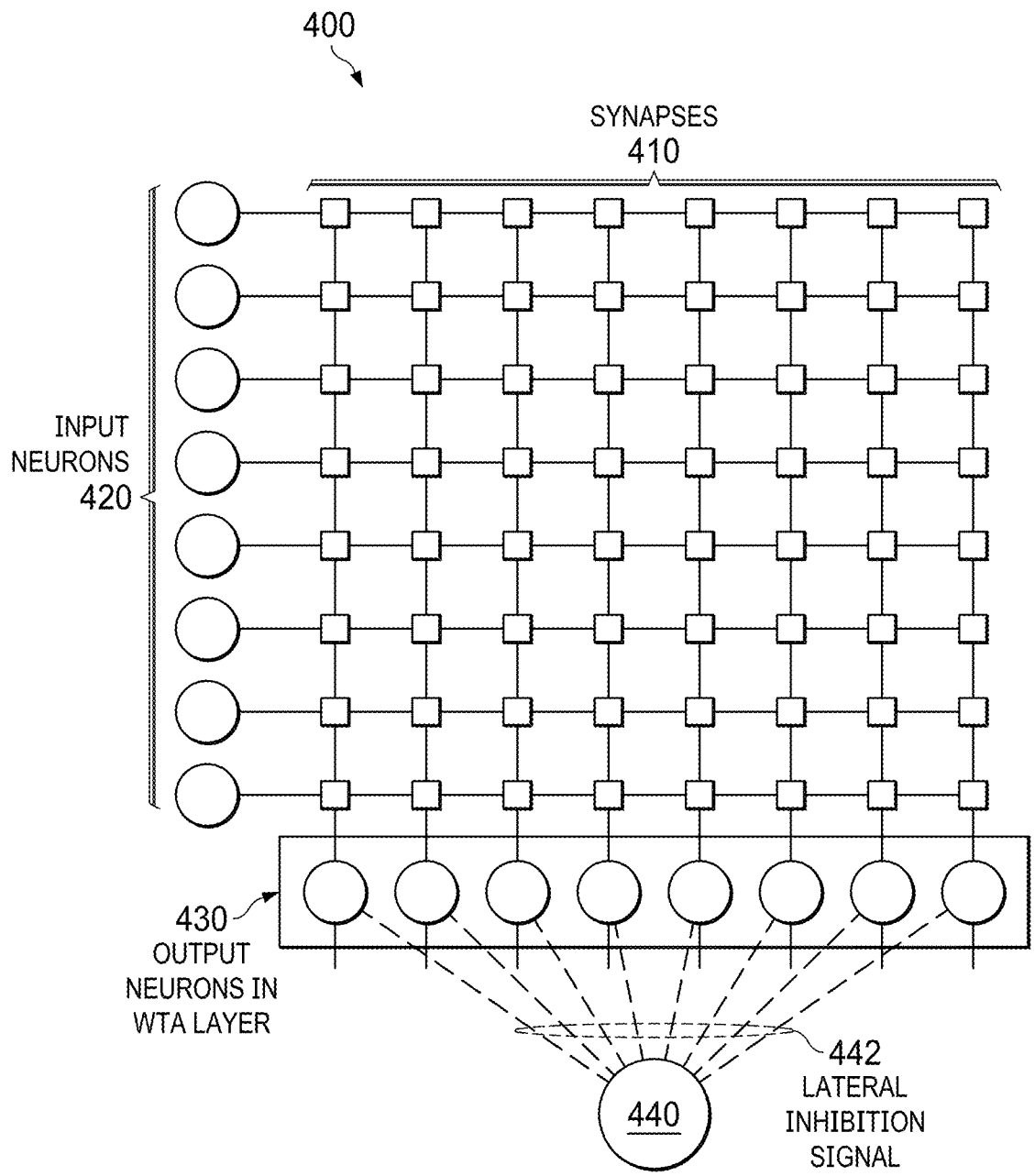
FIG. 4 illustrates a crossbar array in accordance with illustrative embodiments.

FIG. 4 illustrates a crossbar array in accordance with illustrative embodiments. Crossbar arrays enable the area-efficient integration of many devices that can be connected to vertical and horizontal wires. Similar to those frequently used in memory, many neuromorphic crossbar arrays incorporate memristors at each intersection in the array. The neural network crossbar array 400 consists of synapses 410, input LIF neurons 420, and output LIF neurons 430, as shown in FIG. 4. These components are connected in an N×M crossbar array consisting of N horizontal wires (word lines) and M vertical wires (bit lines) such that the crossbar array 400 contains N+M LIF neurons and N*M synapses. Neurons 420, 430 are placed at the inputs of the word lines and at the outputs of the bit lines, respectively, while the synapses 410 are placed at the intersections between the word and bit lines. The individual states of the synapses 410 determine the electrical connectivity between the various input neurons 420 and output neurons 430, and therefore the amount of current transmitted from the input neurons 420 to the output neurons 430. Though FIG. 4 shows an 8×8 crossbar, it should be noted that the size of a crossbar array can be varied and that the structure need not be square.

Different types of devices can be used for the synapses 410. For example, synapse 410 might comprise DW-MTJ synapses, non-volatile resistive switching devices, or memristors.

Lateral inhibition is a process that allows an excited neuron to inhibit, or reduce, the activity of other nearby or connected neurons. One such neural computing system that seeks to take advantage of this is the winner-take-all system. As a form of competitive learning, artificial neurons contend for activation, meaning that only one neuron is chosen as the winner and allowed to fire, using lateral inhibition to suppress the output of all other neurons. After the winning neuron fires, the system is reset and the neurons once again compete for activation. A winner-take-all system is one of the many machine learning paradigms that take advantage of the lateral inhibition phenomenon, which is commonly used in recognition and modeling processes.

In FIG. 4 the output neurons 430 are arranged in a winner-take-all configuration. Depending on the input currents from the input neurons 420 and the weights stored in the crossbar synapses, one output neuron is chosen to fire. As all output neurons are connected, the firing of the winning neuron prevents the firing of the other neurons through lateral inhibition. After the winning neuron fires, the external node 440 emits an inhibitory signal 442, resetting the whole system.

Figure 5A:
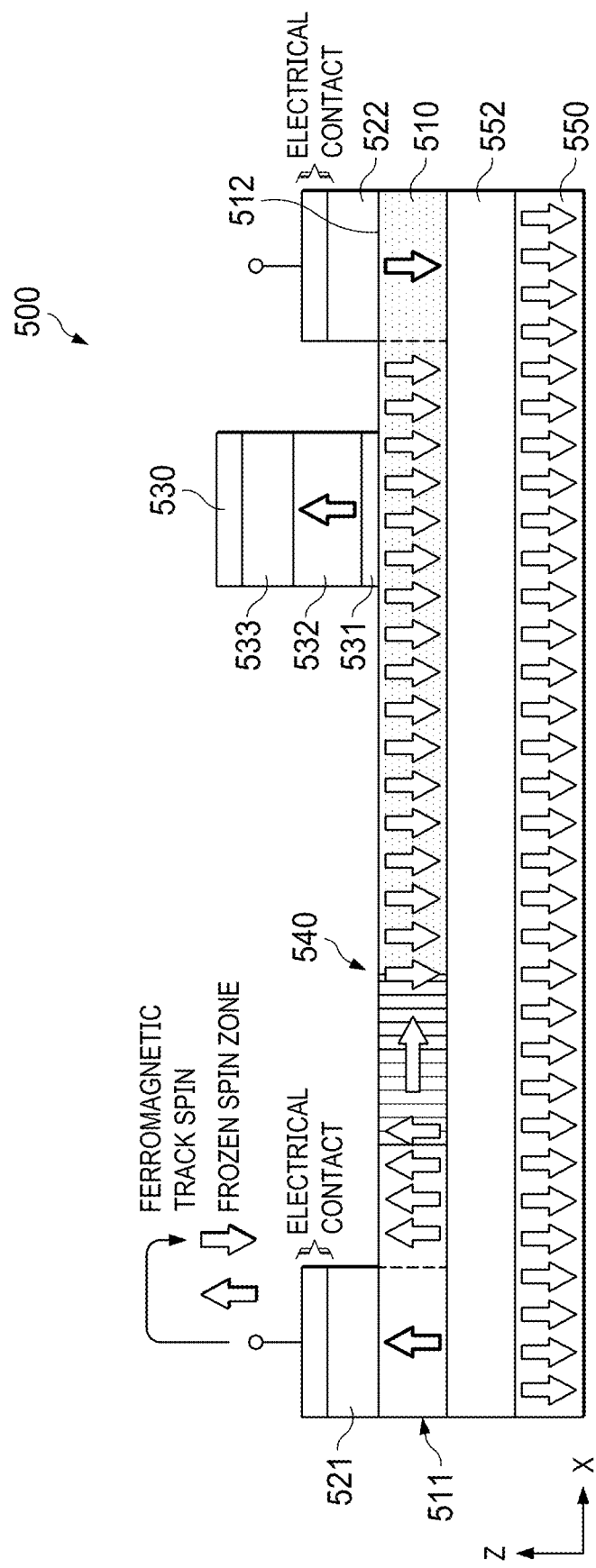
FIG. 5A illustrates a side, cross-section view of a domain wall magnetic tunneling junction device in accordance with an illustrative embodiment.
Figure 5B:
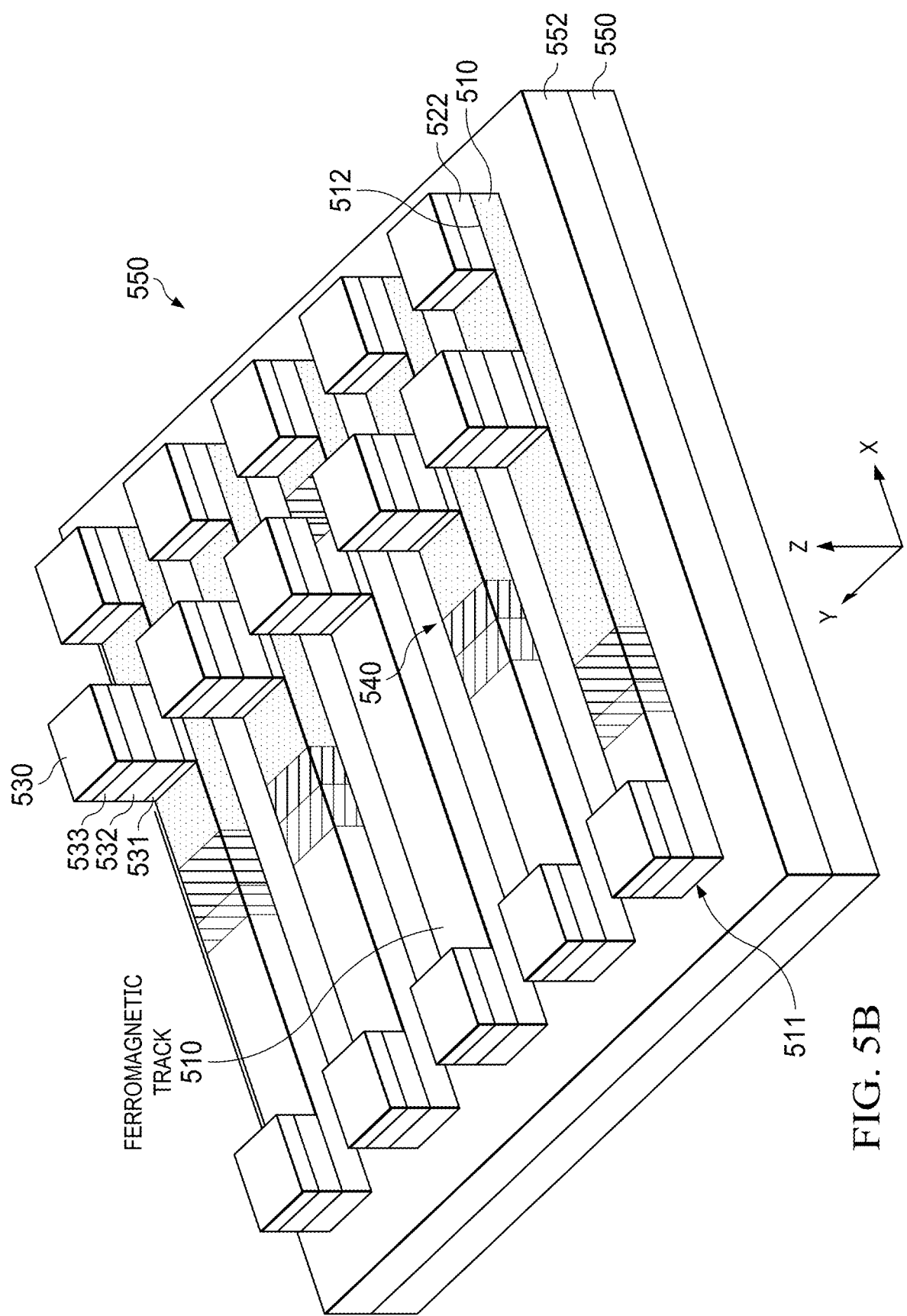
FIG. 5B illustrates a perspective view of a plurality of side-by-side DW-MTJ devices in accordance with an illustrative embodiment.

FIG. 5A illustrates a side, cross-section view of domain wall magnetic tunneling junction (DW-MTJ) device in accordance with an illustrative embodiment. FIG. 5B illustrates a perspective view of a plurality of side-by-side DW-MTJ devices in accordance with an illustrative embodiment.

The DW-MTJ device 500 comprises a soft ferromagnetic track 510 within which a magnetic domain wall (DW) 540 moves. Antiferromagnets 521, 522 at both ends contain the DW within the track 510. A magnetic tunnel junction (MTJ) 530 comprising a tunnel barrier 531, fixed ferromagnet 532, and antiferromagnet 533 is positioned over the ferromagnetic track 510, between the antiferromagnets 521, 522. The MTJ 530 is in either a high or low resistance state depending on the position of the DW 540 in relation to the MTJ. When sufficient current flows through the ferromagnetic track 510, a torque is induced on the DW 540 that causes it to move. Alternatively, spin-orbit torque can be used to provide increased efficiency; the general device behavior would be unchanged.

The DW-MTJ has previously been demonstrated experimentally and can be used to perform logical operations as well as to implement artificial synapses and neurons. These functions are performed by selective use of the three terminals of the device: writing is performed by applying a voltage between the two antiferromagnets 521, 522 such that the current flows through the track 510 to move the DW 540; reading is performed by applying voltage between the MTJ 530 and either side of the device such that the resulting current is dependent on the position of the DW 540 relative to the MTJ 530.

By adding a hard ferromagnet 550 below the DW-MTJ device, the DW-MTJ functions as a leaky integrate-and-fire neuron. The application of current causes the DW 540 to shift within the track 510 for integration. The nearby hard ferromagnet 550 causes the DW 540 to shift in the opposite direction for leaking, and firing occurs when the DW 540 passes beneath the MTJ 530. In addition, magnetostatic coupling between adjacent neurons provides the lateral inhibitory behavior which is critically important for the implementation of neural networks. The intrinsic lateral inhibition—without any peripheral overhead circuitry—enables the design of compact and energy-efficient neurons.

As shown in FIG. 5A, the neuron consists of the DW-MTJ with the addition of a hard ferromagnetic layer 550 beneath the neuron. The bottom magnet stray field affects the DW 540 through an insulating coupling layer 552 whose thickness can be chosen to optimize the proximity field. It should be noted that the method of the present disclosure is not limited to a hard ferromagnet located beneath the DWMTJ device and that other magnetic field sources that are magnetically coupled to and electrically isolated from the ferromagnetic track can be used.

The DW track modeled for this device is 600 nm, 32 nm, and 1.5 nm in the x-, y-, and z-directions, respectively. The track has perpendicular magnetic anisotropy: it is magnetized in the +z direction to the left of the DW 540 and in the −z direction to the right of the DW, as shown in FIG. 5A. The DW magnetization itself rotates in the x-y plane. At either end of the track 510, the antiferromagnets 521, 522 create regions of fixed magnetization region 511, 512 with opposite directions through exchange bias that are modeled in micromagnetic simulation by 30 nm-wide regions of frozen magnetic spins. Therefore, the DW 540 is capable of moving within a 540 nm range in the track. The results described in the remainder of this work are based on Mumax3 simulations with the following magnetic parameters: saturation field value of 1 T, exchange stiffness of $13 \times 10^{-12}$ J/m, perpendicular anisotropy constant of $4 \times 10^5$ J/m$^3$, polarization of spin transfer torque of 1, non-adiabaticity factor of 0.9, Landau-Lifshitz damping constant of 0.015, and discretization cell size of $1 \times 1 \times 1$ nm$^3$.

The leaking functionality is implemented by a 20 mT magnetic field produced by the ferromagnet 550 beneath the DW track 510 in the −z direction. This produces a constant force that results in the DW 540 shifting in the −x direction. In the absence of current and under the sole influence of the magnetic field, the DW 540 shifts in the −x direction toward magnetization region 511 as can be seen from FIGS. 6A-6C.

Figure 6A:
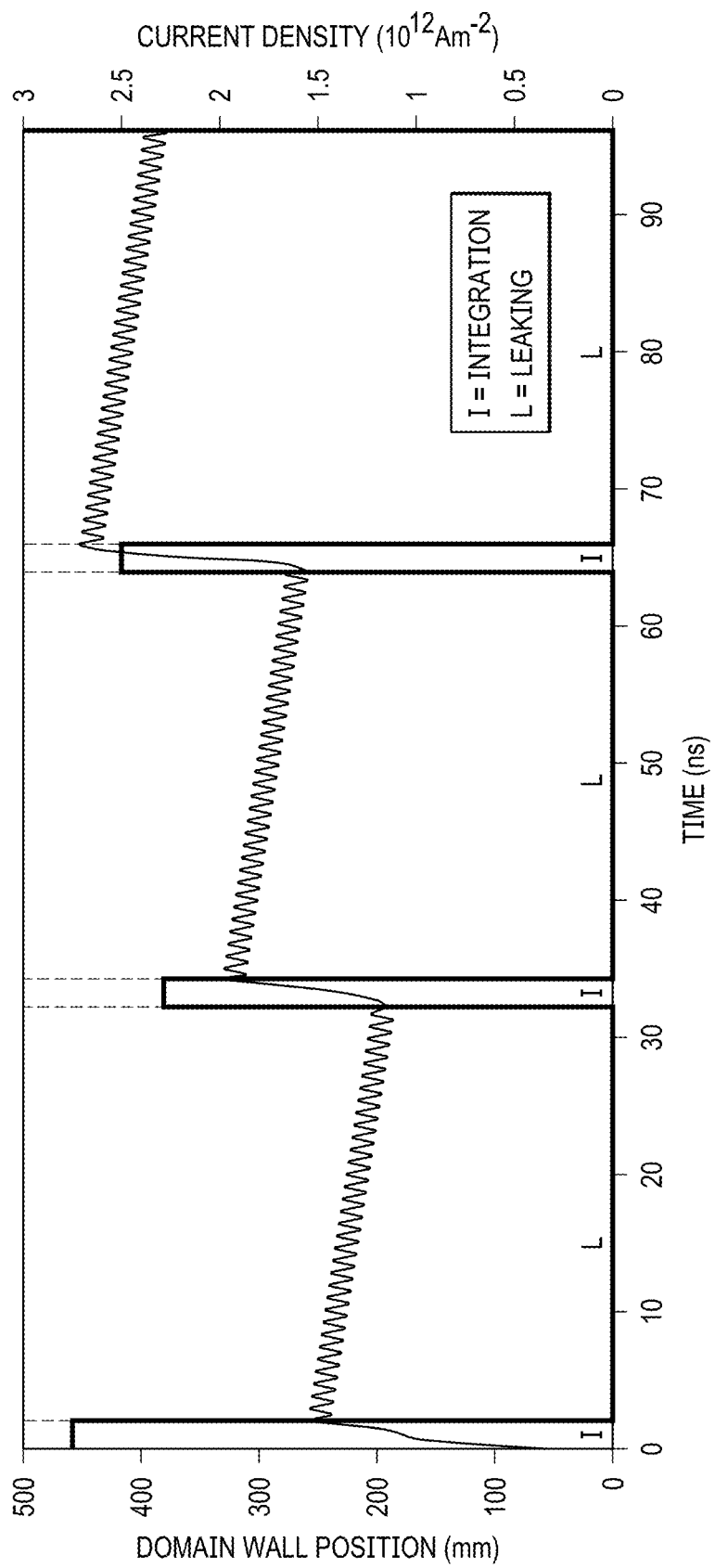
FIG. 6A illustrates a graph of the leaking and integration of a DW-MTJ neuron in accordance with an illustrative embodiment.
Figure 6C:
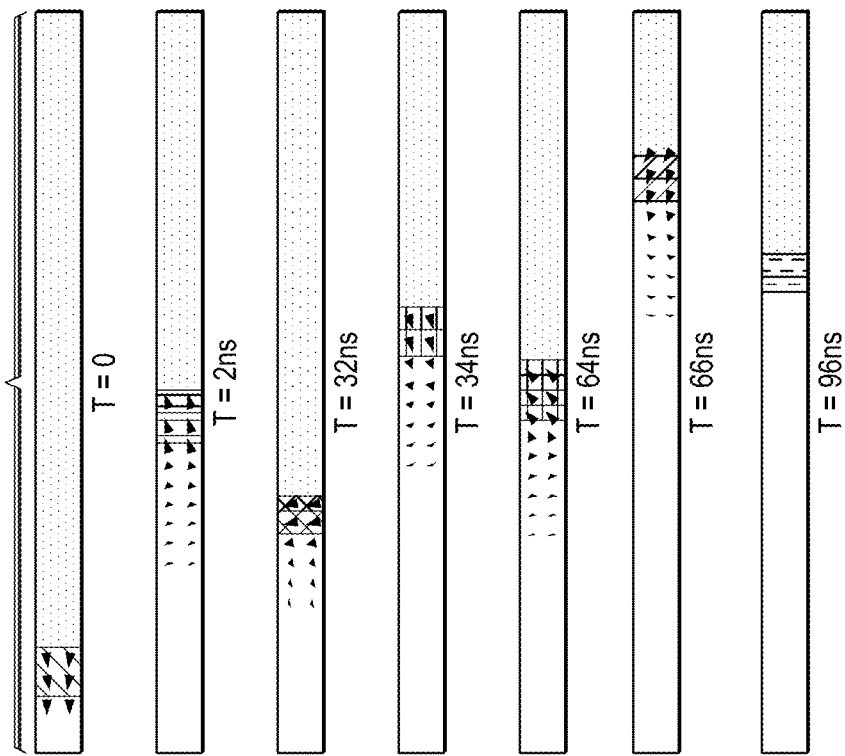
FIG. 6C illustrates the movement of the domain wall over time due to integration of signals and leaking in accordance with an illustrative embodiment.

FIG. 6A illustrates a graph of the leaking and integration of a DW-MTJ neuron in accordance with an illustrative embodiment. The oscillatory DW motion is a result of precession of the DW under the magnetic field. In the absence of an applied current, the DW traverses the entire available track in around 220 ns, which corresponds to an average velocity of 2.5 m/s.

A primary advantage of this leaking technique is that no external excitations are required to drive the leaking mechanism: the hard ferromagnet beneath the DW track continuously provides the required magnetic field. Whereas other proposed neuron leaking schemes require the use of a small leaking current flowing through the neuron that results in resistive power dissipation, the present leaking scheme avoids this power dissipation by replacing the leaking current with a constant magnetic field supplied by a fixed ferromagnet or other magnetic field source. Furthermore, as no external excitations must be applied by an external control circuit to perform leaking, the proposed leaking scheme avoids the hardware costs associated with overhead circuits.

Figure 6B:
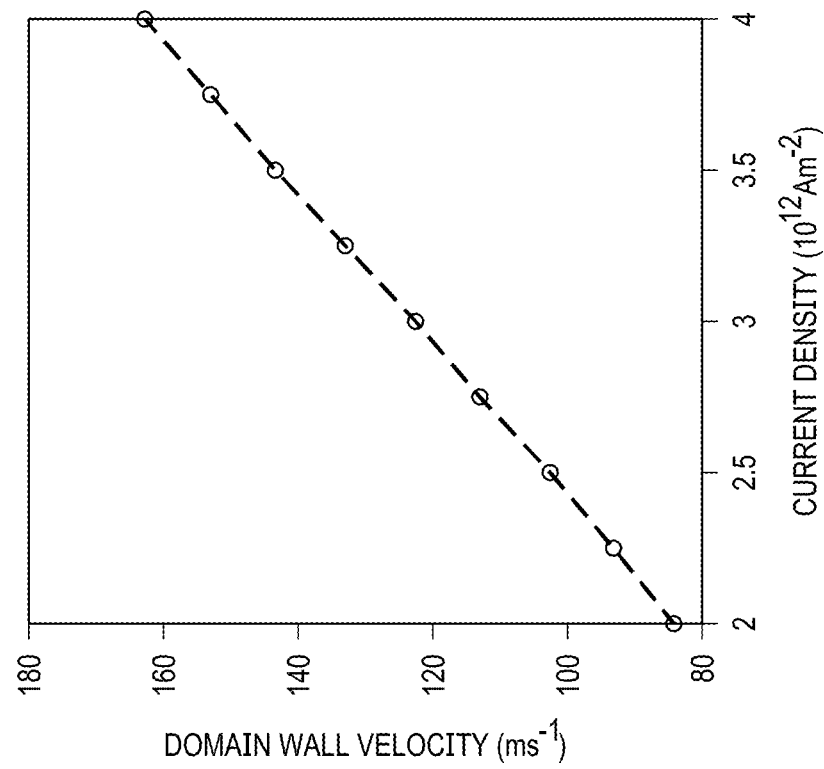
FIG. 6B illustrates a graph depicting the relationship between DW velocity and current density

FIG. 6B depicts the relationship between DW velocity and current density. In order to integrate the input current and eventually cause the neuron to fire, current applied to the DW track above the $\sim 2 \times 10^{12}$ A/m$^2$ threshold current overcomes the leaking field and causes the DW to shift in the +x direction. FIG. 6A therefore demonstrates the ability of the DW-MTJ neuron to both integrate and leak without any external circuitry. As the integration is significantly faster than the leaking, this artificial neuron can continually integrate infrequent input signals that push the DW further and further in the +x direction. This can be seen further in FIG. 6C, which illustrates the movement of the domain wall over time due to integration of signals and leaking.

In the firing operation, the neuron generates an output spike while resetting all the neurons in the same layer to enforce a refractory period during which these neurons cannot fire. The DW-MTJ achieves this through use of the MTJ formed by the track 510, tunnel barrier 531, and pinned ferromagnet 532 above the track as shown in FIG. 5A. When the DW 540 moves sufficiently in the +x direction such that the magnetization direction of both the ferromagnetic track 510 and the pinned ferromagnet 532 is in the +z direction, the MTJ resistance is switched from high to low. This resistance switching can generate an output firing spike and be used as an output signal or propagate to cascaded synapses. In addition, the output firing spike can also trigger a peripheral circuit that resets the neuron by sending a current in the direction opposite to the integrating current. This reset current, in concert with the leaking magnetic field, rapidly resets the neurons to prepare for the next set of inputs from the synapses.

Figure 7:
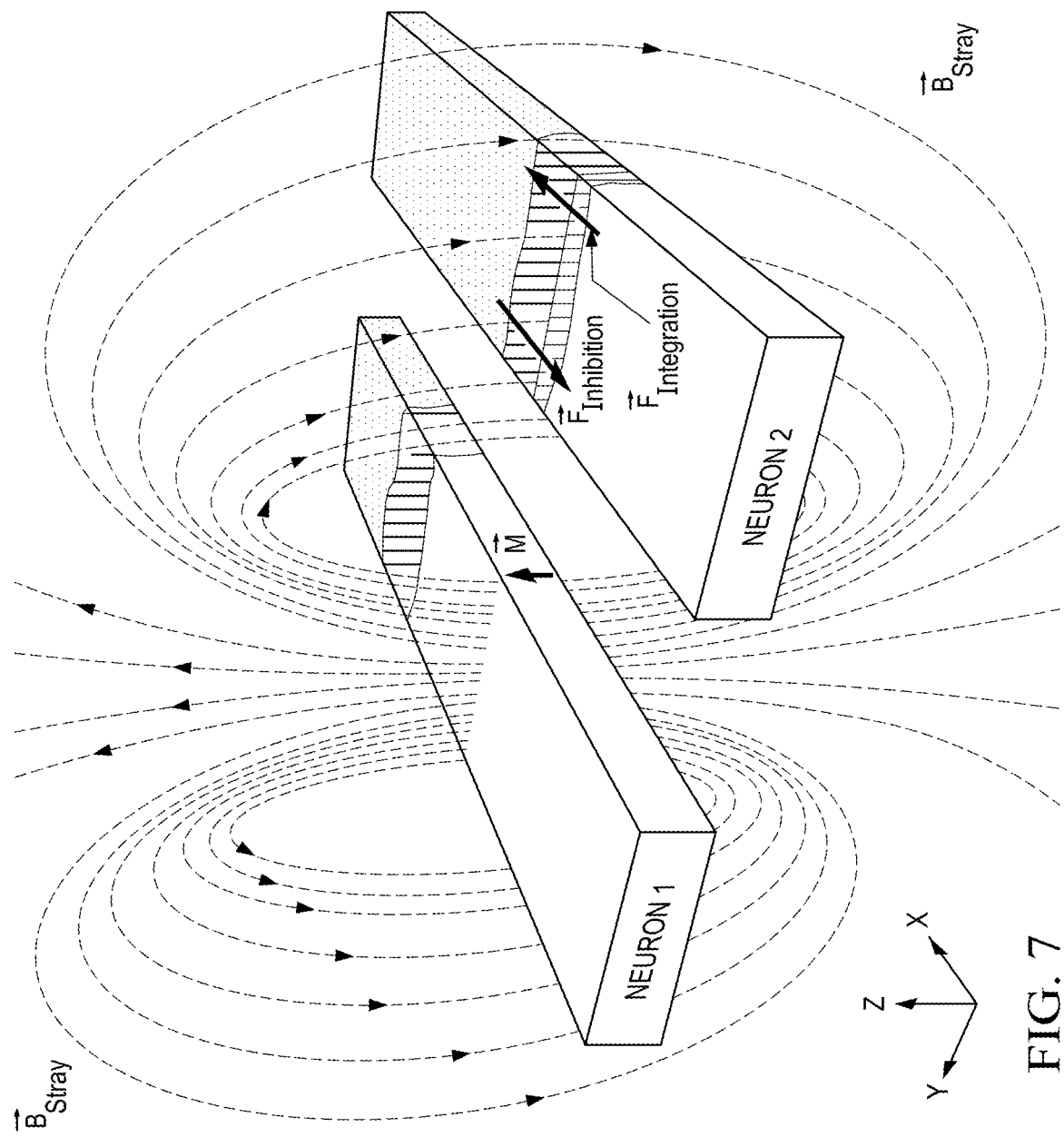
FIG. 7 illustrates lateral inhibition in accordance with illustrative embodiments.

FIG. 7 illustrates lateral inhibition in accordance with illustrative embodiments. In neuroscience, the relation between two neurons can be such that the excitation of one neuron inhibits the other neuron from firing. This mechanism is referred to as lateral inhibition. For neighboring ferromagnetic tracks above a shared fixed ferromagnet (or within a shared magnetic field), as depicted in FIG. 5B, the motion of a DW can be inhibited by the stray fields from neighboring neurons. In particular, each ferromagnetic track creates a dipolar electric field that attempts to orient neighboring neurons antiparallel (repulsive coupling). This pushes a slower neighboring DW in the opposite direction and thus laterally inhibits the slower neuron. To induce repulsive coupling, the neighboring tracks should be polarized as shown in FIG. 7.

The DW-MTJs provide lateral inhibition with the DW velocity of a particular ferromagnetic track dependent on the current flowing through neighboring tracks. The stray magnetic field from neuron 1 pushes the DW of neuron 2 in the −x direction, impeding the +x directed integration. Neuron 2 also produces stray magnetic fields (not shown) that influence neuron 1.

Figure 8:
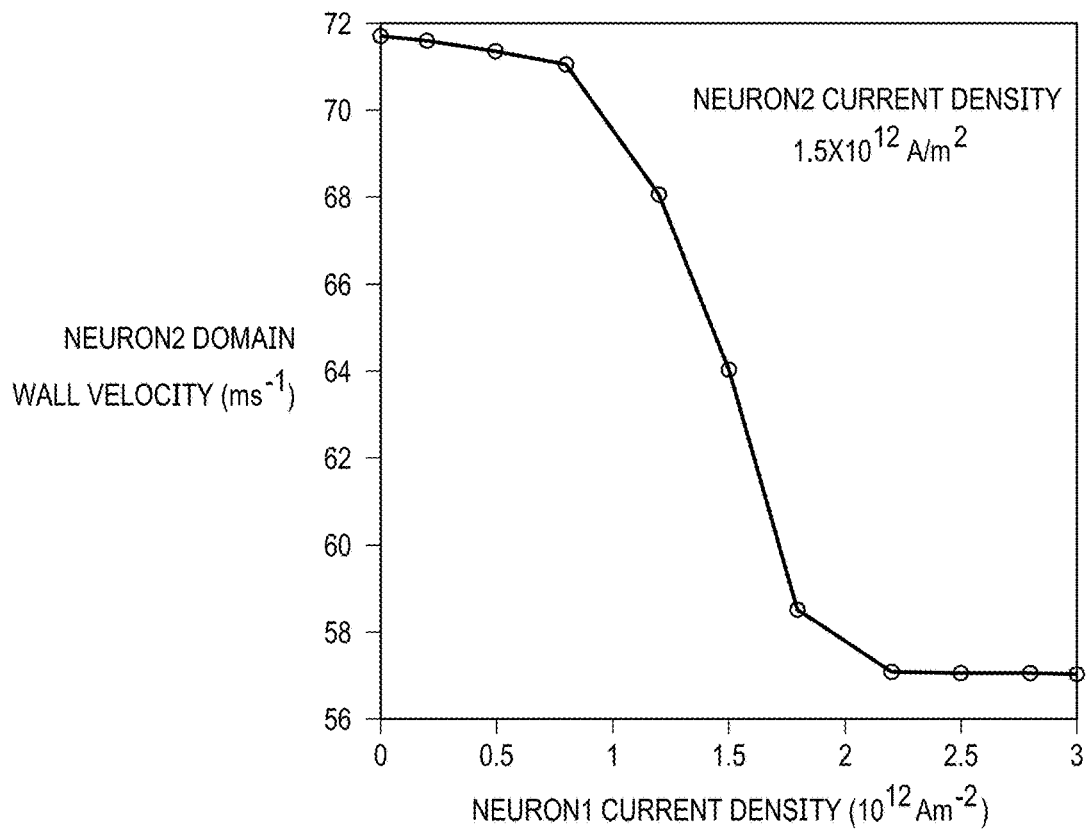
FIG. 8 illustrates the relationship between the DW velocity of a particular track with its neighboring track current density in accordance with illustrative embodiments.

FIG. 8 illustrates the relationship between the DW velocity of a particular track with its neighboring track current density in accordance with illustrative embodiments. A $1.5 \times 10^{12}$ A/m$^2$ fixed current density is applied through ferromagnetic neuron2 while the current density through neuron1 is varied between 0 and $3 \times 10^{12}$ A/m$^2$. When neuron1's current density increases beyond the neuron2's current density, neuron2's DW velocity is significantly reduced.

FIGS. 9A and 9B illustrates micromagnetic simulation snapshots of two z-axis-polarized ferromagnetic tracks in accordance with an illustrative embodiment. Two ferromagnetic tracks are separated by 6 nm along the y direction, with two different sets of applied current densities. In FIG. 9A $1.5 \times 10^{12}$ and $2 \times 10^{12}$ Am$^{-2}$ are applied along the top (neuron2) and bottom (neuron1) tracks, respectively.

In FIG. 9B $1.5 \times 10^{12}$ and 0 Am$^{-2}$ current densities are applied, respectively, thus enabling the DW to reach the right end point earlier than in FIG. 9A. In this case, the inhibitory property of neuron1 is diminished by applying no current through it. Thus, due to the lack of inhibition in this situation, neuron2's DW can reach the right end point of the track earlier than in FIG. 9A. The snapshots are taken 7.3 ns after the application of current.

Figure 10A:
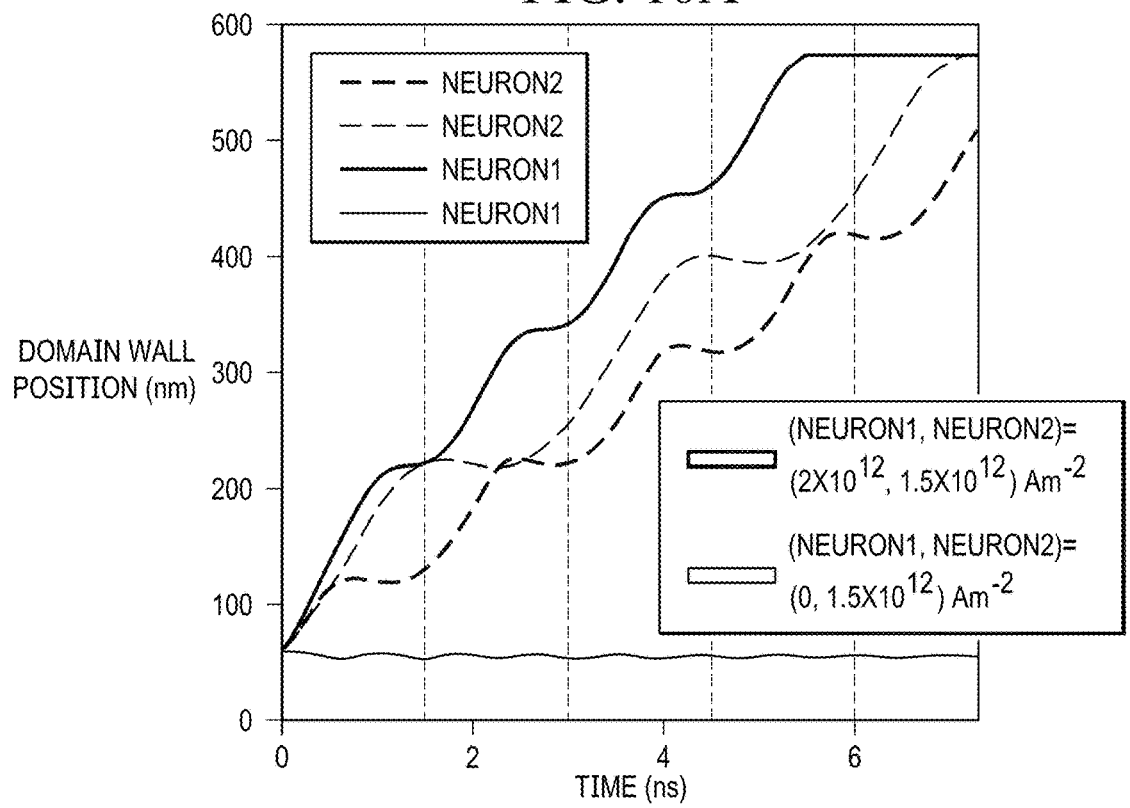
FIG. 10A illustrates a graph depicting the relationship between domain wall position and time in accordance with an illustrative embodiment.

FIG. 10A illustrates a graph depicting the relationship between domain wall position and time in accordance with an illustrative embodiment. FIG. 10A shows DW position versus time, demonstrating the ability of neuron1 to inhibit the motion of neuron2. The relatively slower motion of neuron2 in the situation in FIG. 9A as compared to the situation in FIG. 9B is a clear indication of lateral inhibition.

Figure 10B:
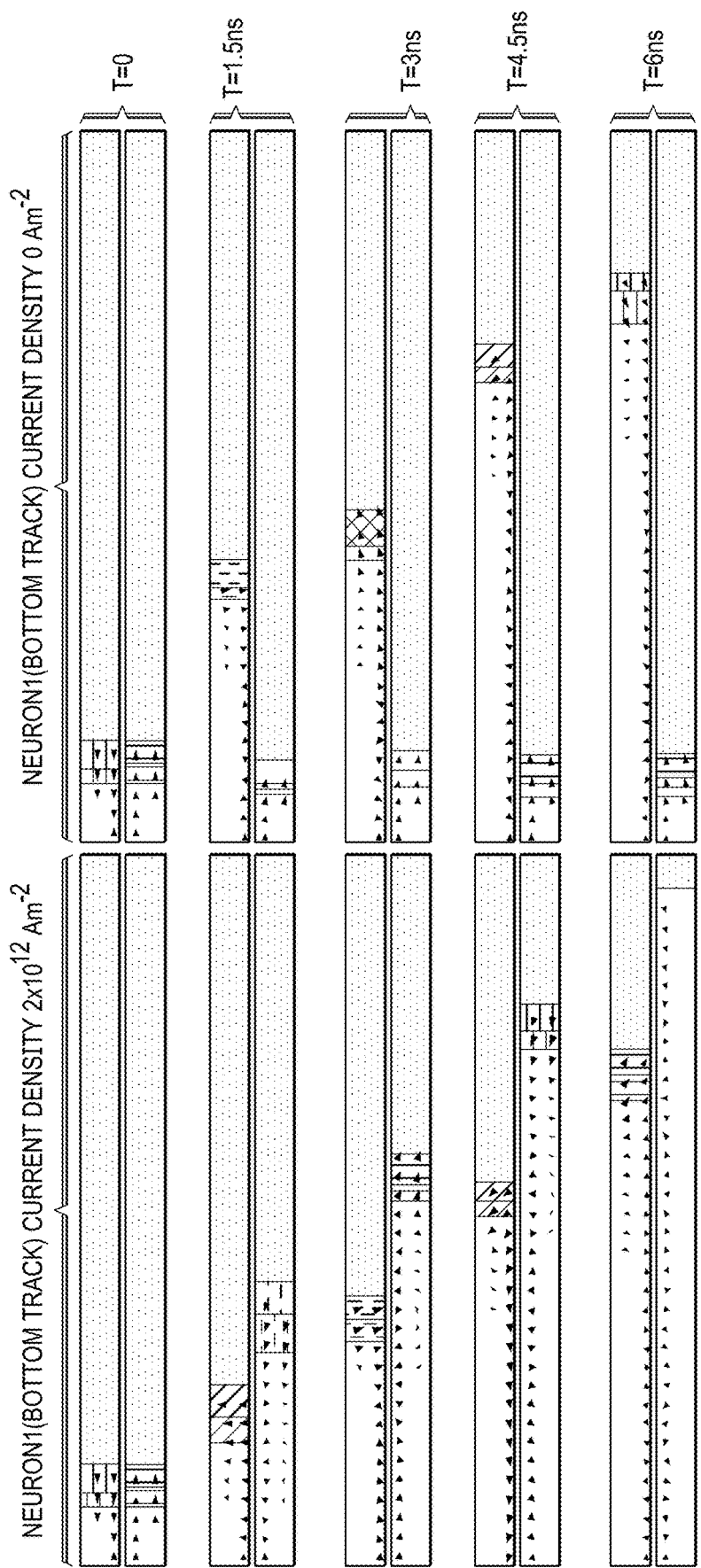
FIG. 10B illustrates domain wall propagation of laterally inhibited neurons in accordance with an illustrative embodiment.

FIG. 10B illustrates domain wall propagation of laterally inhibited neurons in accordance with an illustrative embodiment. FIG. 10B shows snapshots of the DW propagation at an interval of 1.5 ns for the two current density sets. Each set of images corresponds to a time marked by the dashed lines in FIGS. 9A and 9B. This snapshot is the first demonstration of intrinsic lateral inhibition between artificial neurons without external circuitry.

To verify the effectiveness of this system, the well-known handwritten digit recognition test is run with micromagnetic simulation. 8×8 resolution handwritten digits are sourced from the scikit-learn database and run through a synapse crossbar, with the first neuron to fire determining the classification of the digit. Overall, the system had a 94% accuracy in selecting the correct winning neuron that corresponded with the currents provided by the synapse array.

In order to evaluate the behavior of the proposed spintronic neurons in a larger nanoelectronic environment, an actual data science task was presented to a simulated memristive crossbar of generic nanodevice synapses. The chosen data science task was the digits database imported from the Python library scikit-learn, which is a downsampled version of the classic MNIST database (64 instead of 784 input features). The database consists of 1797 total samples of handwritten digits in 10 separated classes. The simulated crossbar learns using a binary adaptation of the classic Widrow-Hoff learning algorithm; the analog input features are mapped to the voltage domain and presented in a sign-symmetric fashion such that each component of the input Xi feeds into a positive line Xi+ and a negative line Xi−. Considering the bias lines and the ten different classes of outputs, the simulated crossbar has a dimensionality of 130 input wires and ten output wires.

Before learning, the database is separated into a training set of 1300 samples and a testing set of 497 samples, which are never mixed. During a separated training phase consisting of ten epochs of shuffled presentation of the training dataset, the conductance of all synapses in the array is progressively adapted in order to minimize training error. During the testing phase, the trained crossbar performs inference. Electrically, the unknown digits are presented to the input wires and ten output currents are automatically obtained at the output.

Large-scale micromagnetic simulations of an array of ten of these neurons are simulated to demonstrate the effectiveness of this neuron for neuromorphic applications. Each of the ten neurons represents the recognition of one digit, and their 20 nm separation is close enough for lateral inhibition to occur. While this 20 nm separation represents an aggressive scaling target, it can be achieved using high-resolution lithography processing; magnetic tunnel junctions have been patterned down to 20 nm diameter with on/off ratios greater than 100%, and block copolymer methods have resulted in close-packed magnetic tunnel junction disks with 13 nm separation.

The lateral inhibition, in this system, implements a "winner take all" functionality—if one of the neurons has a higher input current than the others, the current flowing through the other neurons is insufficient to shift the DW against the spin transfer torque. This ensures that only one neuron is able to fire at a time. To test the effectiveness of this system, we apply the output currents attained from the method described above. Before these current density values are used, they are normalized to the acceptable neuron current range of $1.5\times10^{12}$ to $4\times10^{12}$ A/m$^2$. After normalization, the currents can be applied to each of the ten devices as the integrating input current. Once the DW has shifted along 95% of the track and across the MTJ, the MTJ resistance switches and the neuron fires. The firing mechanism sends a current to reset the neurons as soon as one DW position traverses the MTJ. Finally, there is a leaking phase at the end of the simulation, to demonstrate the leaking ability of the device, which along with the reset current represents the refractory period. The application of each input number lasts a constant time of 30 ns, with the time of the leaking phase varying depending on the time of the integrating phase.

Figure 11A:
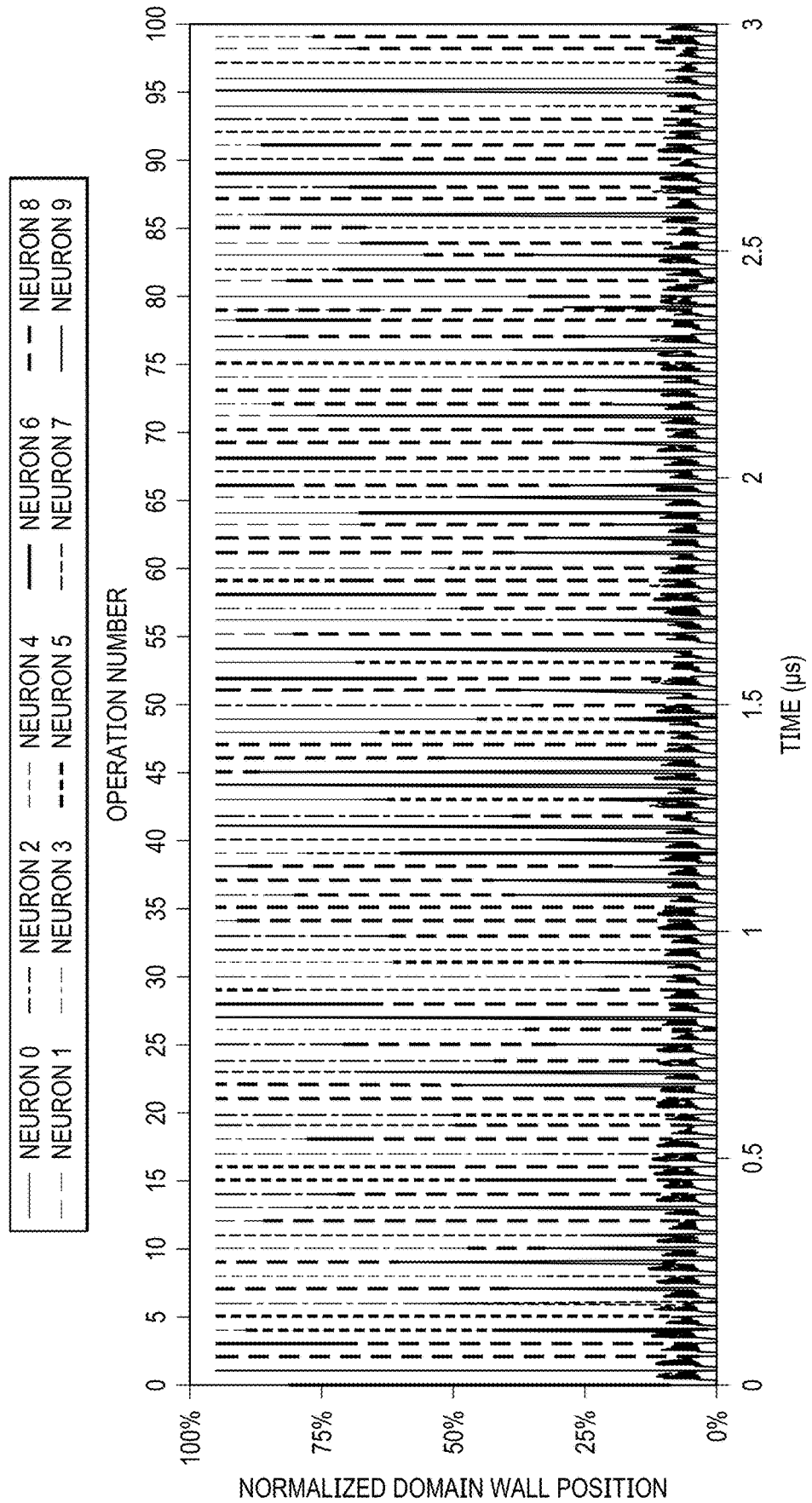
FIG. 11A illustrates a graph of simulation results of a laterally-inhibited, ten-neuron, winner-take-all output layer in accordance with an illustrative embodiment.

FIGS. 11A-11D illustrate simulation results of a laterally-inhibited, ten-neuron, winner-take-all output layer in accordance with an illustrative embodiment. FIG. 11A displays the results in graph form, after 100 cycles have run. Each simulation lasts for 30 ns, with each spike representing one digit. The winner of each cycle can be seen by which color reaches the end of the track (in this case, the 95% mark), with each color corresponding with a neuron.

Figure 11B:
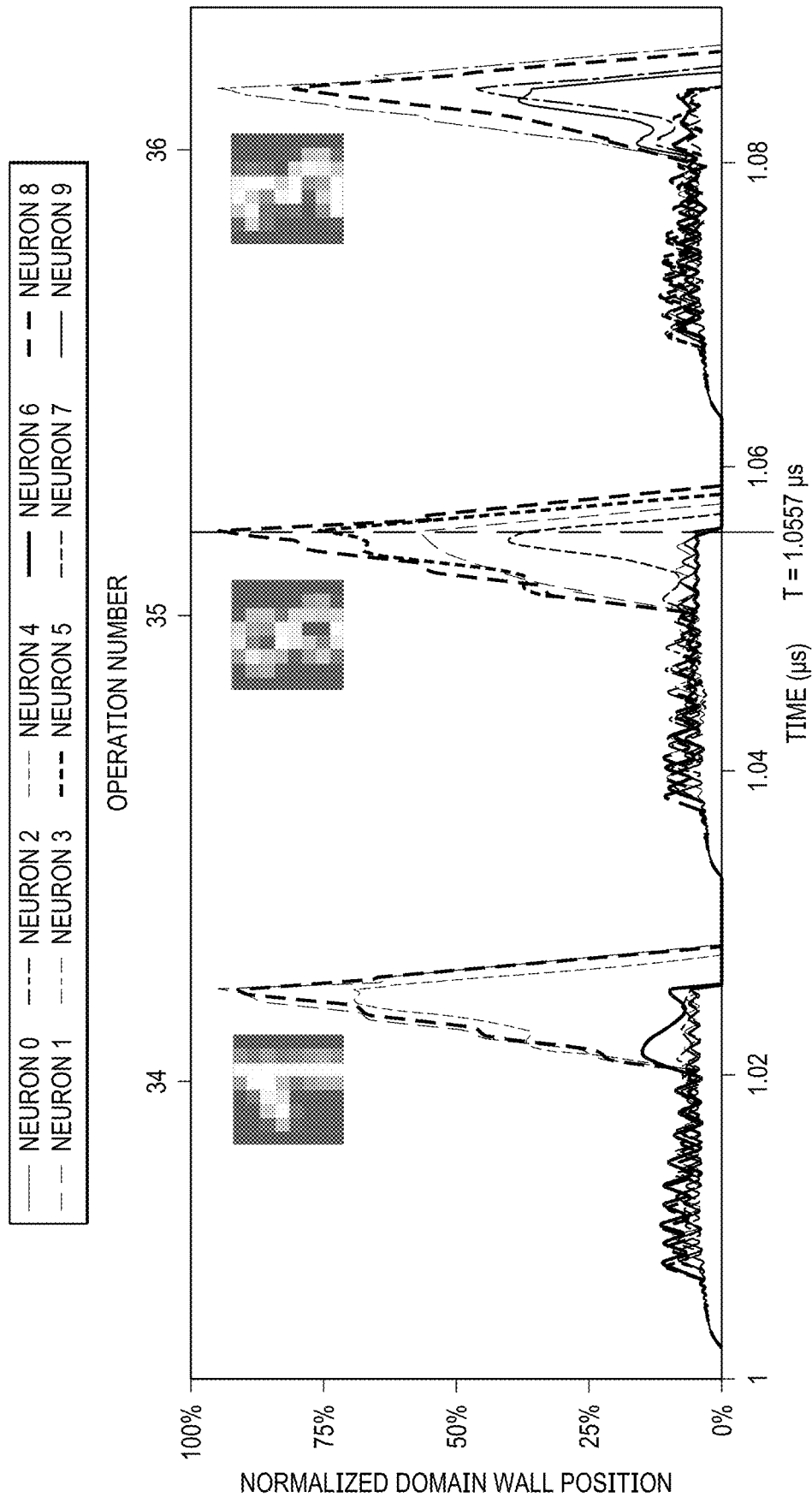
FIG. 11B illustrates a zoomed-in portion of the graph in FIG. 11A with the original input images.

For a clearer representation of three cycles, a zoomed-in version is provided in FIG. 11B along with the original input image in order to add context to what was being identified.

Figure 11C:
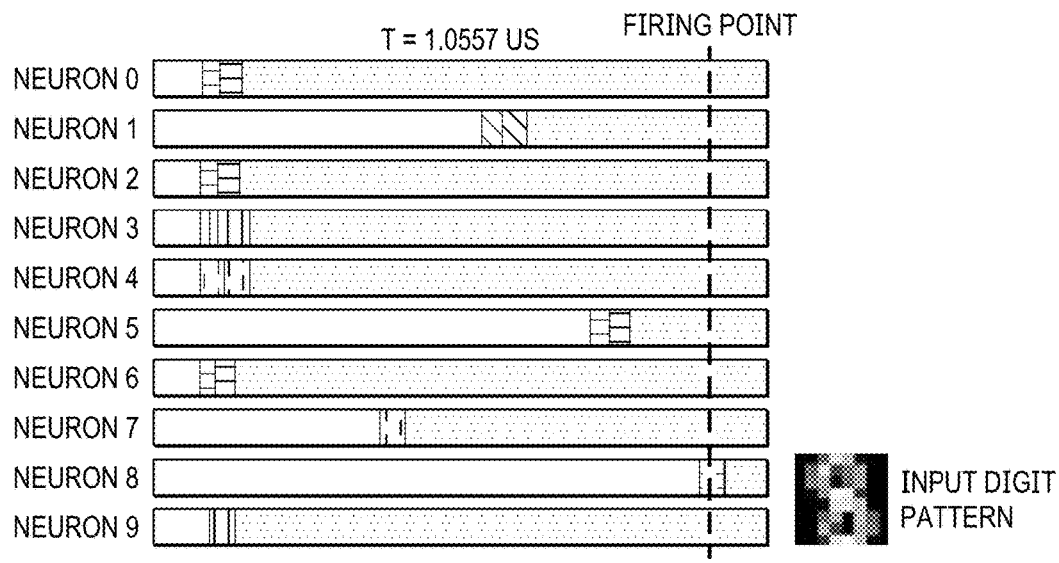
FIG. 11C provides a visualization of the laterally-inhibited, winner-take-all graph data in FIG. 11A.

FIG. 11C provides a visualization of the graph data, showing a Mumax3 simulation snapshot. This figure only represents only one cycle of graph data, at the climax of the firing phase. The 8×8 input image is provided below, to provide context on the handwritten digit being identified by the system. In this case, since neuron #2 fired, the system correctly identified the image.

Figure 11D:
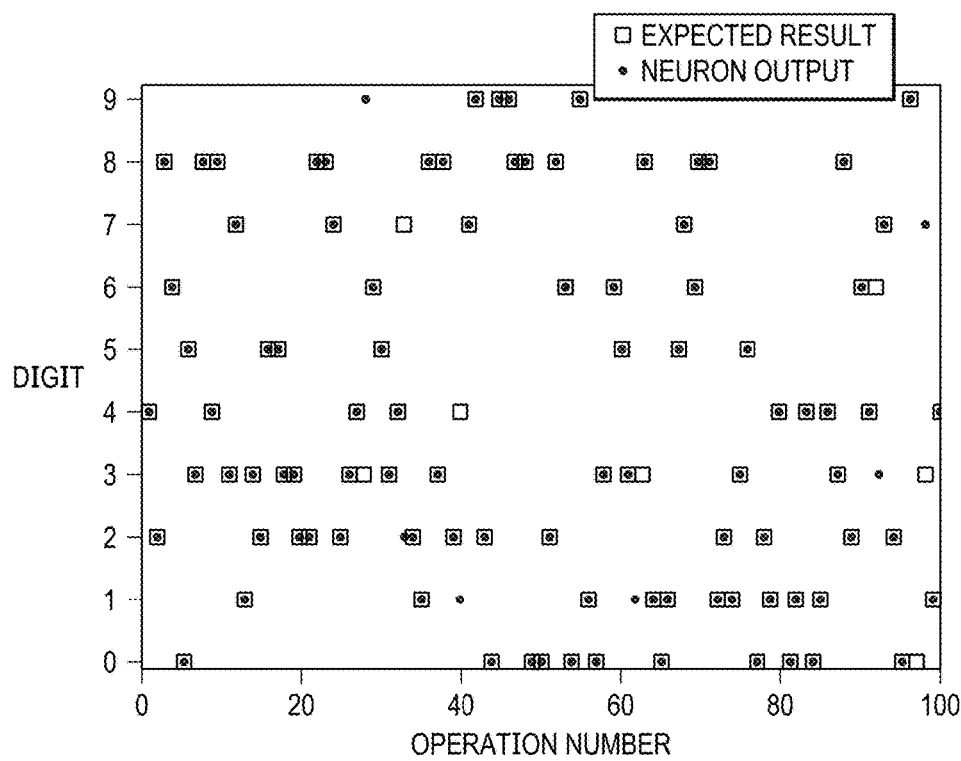
FIG. 11D shows a plot of expected results vs. output digit of laterally-inhibited, ten-neuron, winner-take-all output layer in accordance with an illustrative embodiment.

FIG. 11D shows a plot of expected results vs. output digit. Every input digit data point that is visible is therefore a failed classification. When the output matches the input, they overlap. This system had a 94% accuracy in selecting the correct winning neuron that corresponded with the currents provided by the synapse array. Similar to other neuromorphic systems, this neuron output layer is highly tolerant to fabrication imprecision.

Figure 12A:
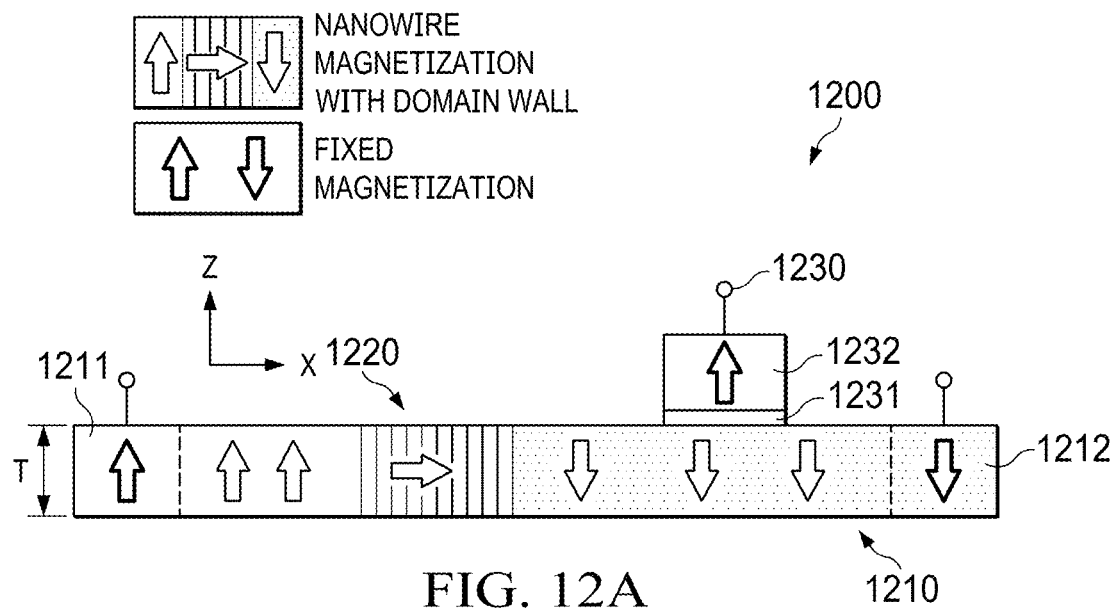
FIG. 12A illustrates a side, cross-section view of a three-terminal, magnetic tunnel junction (3T-MTJ) device with a trapezoidal ferromagnetic track in conjunction with an illustrative embodiment.
Figure 12B:
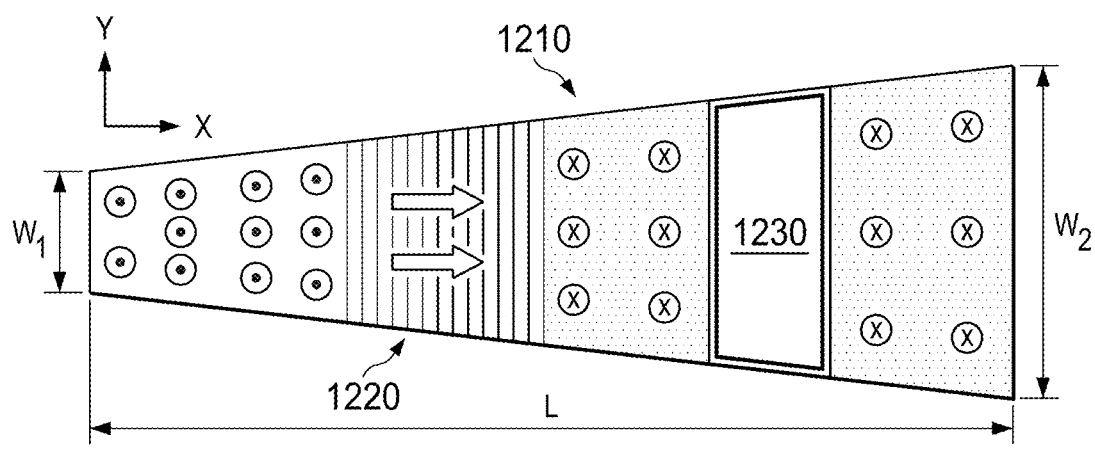
FIG. 12B illustrates a top plan view of a three-terminal, magnetic tunnel junction (3T-MTJ) device with a trapezoidal ferromagnetic track in conjunction with an illustrative embodiment.

FIG. 12A illustrates a side, cross-section view of a three-terminal, magnetic tunnel junction (3T-MTJ) device 1200 with a trapezoidal ferromagnetic track in conjunction with another illustrative embodiment. FIG. 12B illustrates a top plan view of device 1200. Similar to the device 500 in FIGS. 5A and 5B, device 1200 includes a ferromagnetic track 1210 with fixed magnetizations regions 1211, 1212 with opposite directions at each end of the track. A MTJ 1230 comprising a tunnel barrier 1231 and ferromagnet 1232 is located between the fixed magnetic regions 1211, 1212.

However, this embodiment comprises a ferromagnetic track 1210 having a trapezoidal x-y cross-section, as shown in FIG. 12B, instead of a rectangular x-y cross-section. Similar to the conventional 3T-MTJ, there is a Neel DW 1220, in which a magnetization is in the +z-direction to the left of the DW 1220, and the −z-direction to the right of the DW.

Micromagnetic simulations were performed with Mumax3, with length L of 250 nm, left-hand width W1 of 25 nm, right-hand width W2 of 100 nm, and thickness t of 1.5 nm. The fixed magnetizations 1211, 1212 at either end of the ferromagnetic nanowire cover 10 nm from each edge, providing the DW 1220 with a 230 nm range of motion. The material parameters represent CoFeB, with an exchange stiffness $A_{ex}$ of $13\times10^{-12}$ J/m, a Landau-Lifshitz-Gilbert damping constant α of 0.05, a non-adiabaticity factor ξ of 0.05, a magnetic saturation value $M_{sat}$ of 1 T, and a uniaxial anisotropy in the z-direction with a magnitude of $5\times10^5$ J/m$^3$. The cell size is 1×1×1.5 nm$^3$, and the external magnetic field $B_{ext}$ is 0 T everywhere. The COMSOL multiphysics simulator was used to determine the electrical current density through this trapezoidal structure.

Because of the trapezoidal structure of the ferromagnetic nanowire 1210, the energy of a DW 1220 is dependent on the position of the DW along the length of the track. In particular, the DW energy depends on the shape anisotropy of the magnetic material, and the asymmetric shape modifies the demagnetization factor of the magnetic structure. The DW energy is highest where the width is largest, and is lowest where the width is smallest. Therefore, in order to minimize the DW energy, the DW 1220 autonomously moves leftward from higher-energy positions at the right (wide) side of the wire to lower-energy positions at the left (narrow) side of the wire.

Figure 13A:
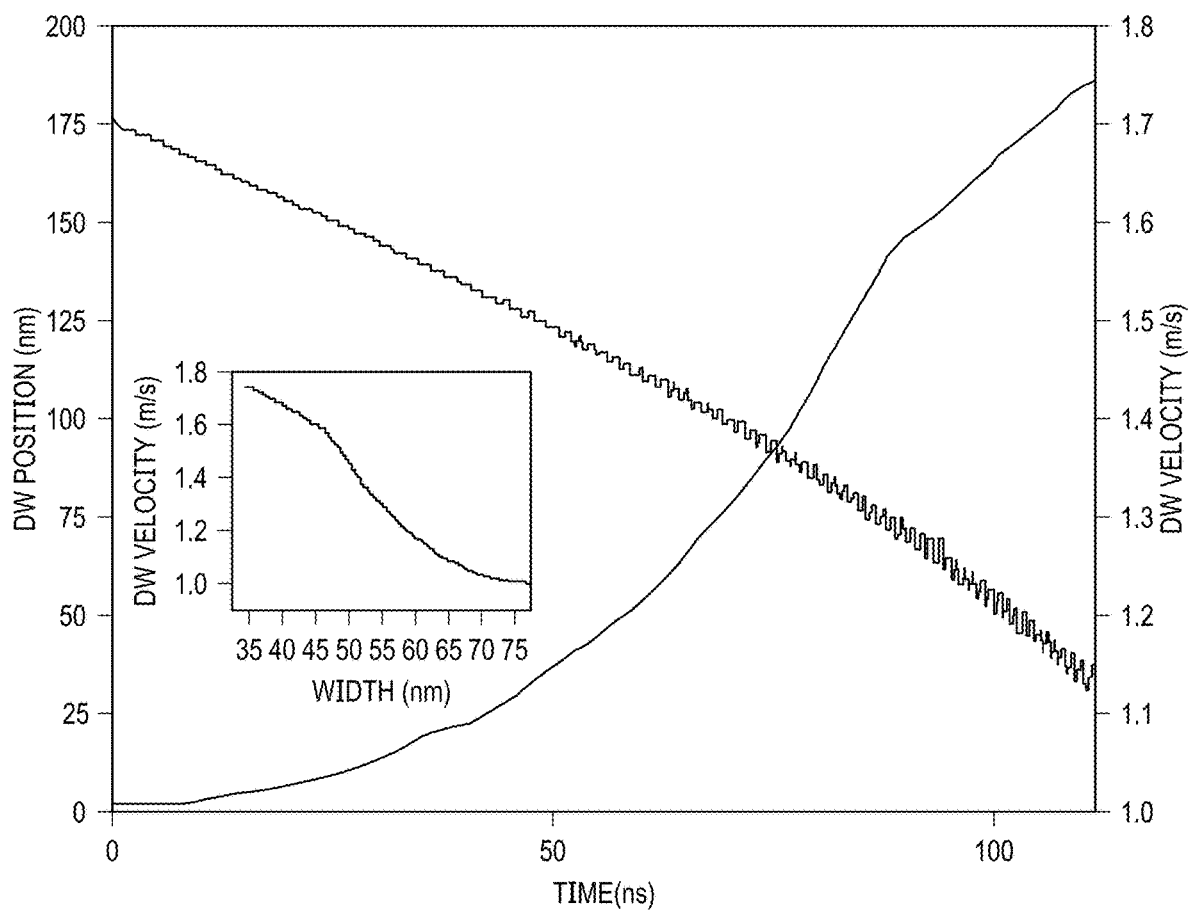
FIG. 13A illustrates a graph of DW position and velocity as functions of time with no external stimuli in accordance with an illustrative embodiment.
Figure 13B:
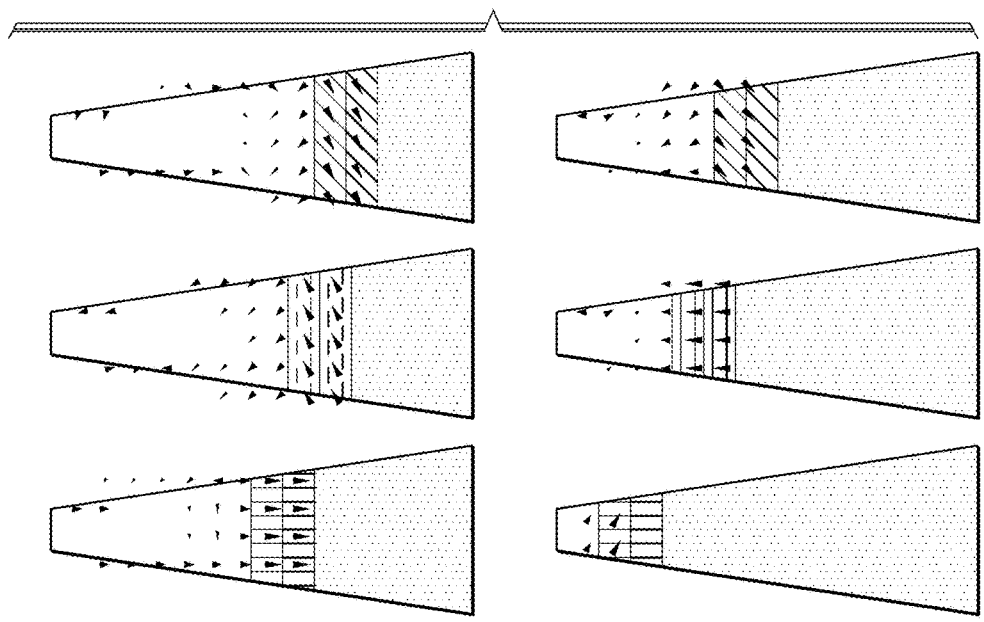
FIG. 13B illustrates micromagnetic snapshots of DW drift with no external stimuli in accordance with an illustrative embodiment.

FIGS. 13A and 13B illustrate shape-based domain wall drift with no external stimuli in accordance with an illustrative embodiment. The DW is initialized 175 nm from the narrow left edge of the nanowire track (75 nm from the wide right edge), and gradually drifts towards the narrow left edge. No electrical current or magnetic field is applied. The DW precesses as it drifts, generating the ripple seen in the position over time; the DW maintains a steady-state position while continually precessing once it reaches the stable position 28 nm from the left edge. It can further be seen that the DW velocity increases as the DW approaches the narrow edge of the nanowire.

FIG. 13A shows position and instantaneous velocity of the DW as functions of time. The inset shows velocity as a function of the DW width. The position was calculated based on the minimum of the absolute value of the z-directed magnetization along the central axis of the nanowire length; the velocity was determined from DW position with moving averages to smoothen the effects of precession. FIG. 13B show micromagnetic simulation snapshots for: (b) t=0, (c) t=22 ns, (d) t=44 ns, (e) t=66 ns, (f) t=88 ns, and (g) t=110 ns.

The field-free and current-free movement of the DW from a wider to narrower region of the ferromagnetic track depends on the energy difference of the demagnetization field due to the asymmetric shape compared to the pinning energy of the DW due to intrinsic and extrinsic defects in the wire, for example from dopants and edge roughness. The simulations described herein were performed at zero temperature in a perfect wire without these pinning effects. Experimental demonstration of the proposed neuron at room temperature should therefore be feasible with a sufficiently pristine nanowire.

The shape-based DW drift provides a native representation of neuron leaking that enables simplification of the device structure. Whereas previous spintronic neuron proposals have required external currents, magnetic fields, or additional device layers, the shape-based DW drift enables an artificial 3T-MTJ neuron with an intrinsic leaking capability. The integration and firing capabilities are retained in a manner similar to previous proposals, rounding out the requirements for an LIF neuron.

Figure 14:
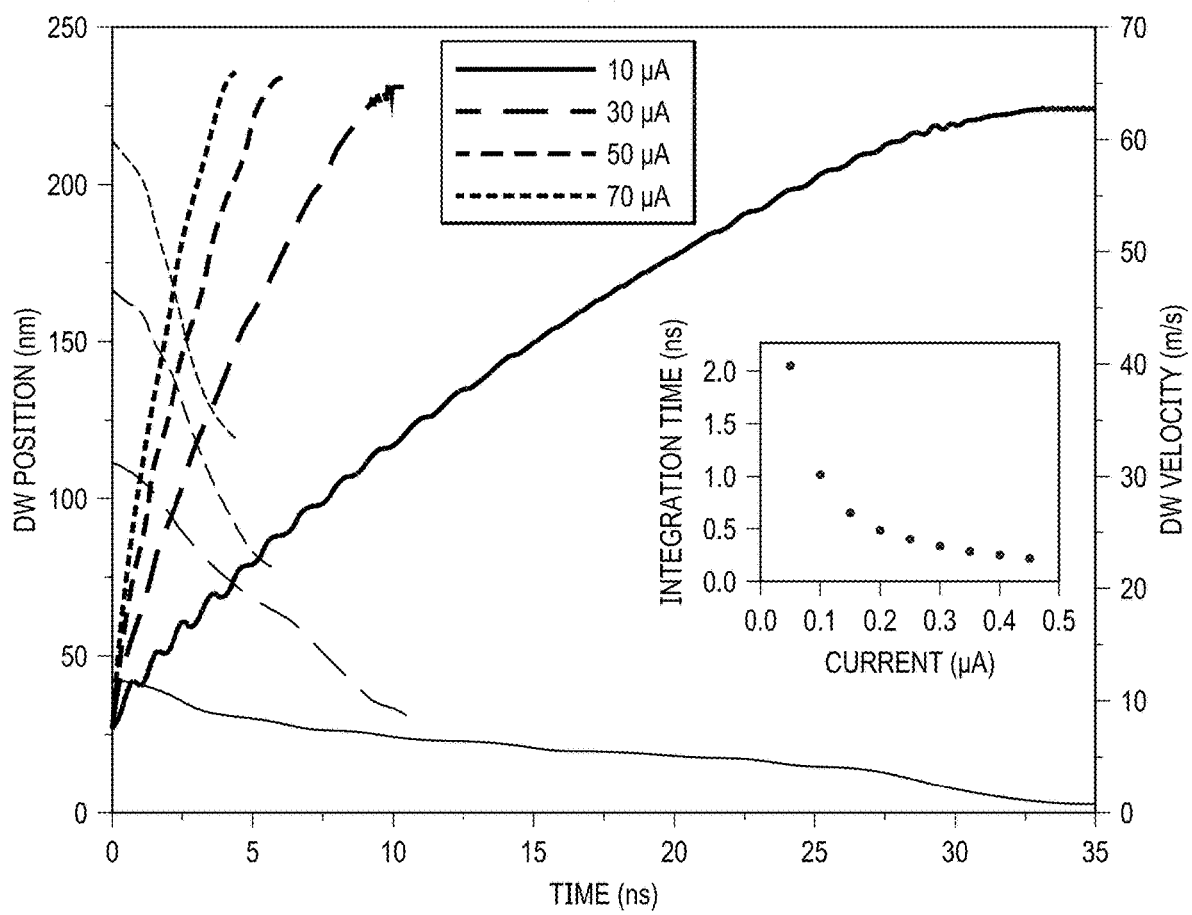
FIG. 14 illustrates position and instantaneous velocity of the DW for various currents in accordance with an illustrative embodiment.

FIG. 14 illustrates position and instantaneous velocity of the DW for various currents in accordance with an illustrative embodiment. Positions are represented as solid curves, while velocities are represented by dashed curves. The inset shows the time taken for a DW to shift 100 nm from the stable position (28 nm from the left edge of the device) as a function of the current passed through the DW track. Current through the device is integrated through motion of the DW. The DW velocity is dependent on the applied current as shown in FIG. 14, with larger currents causing faster integration of the externally-applied signal. With this trapezoidal prism, the DW velocity is also influenced by the width, as discussed previously in relation to the leaking; the DW moves faster where the width is smaller.

Figure 15A:
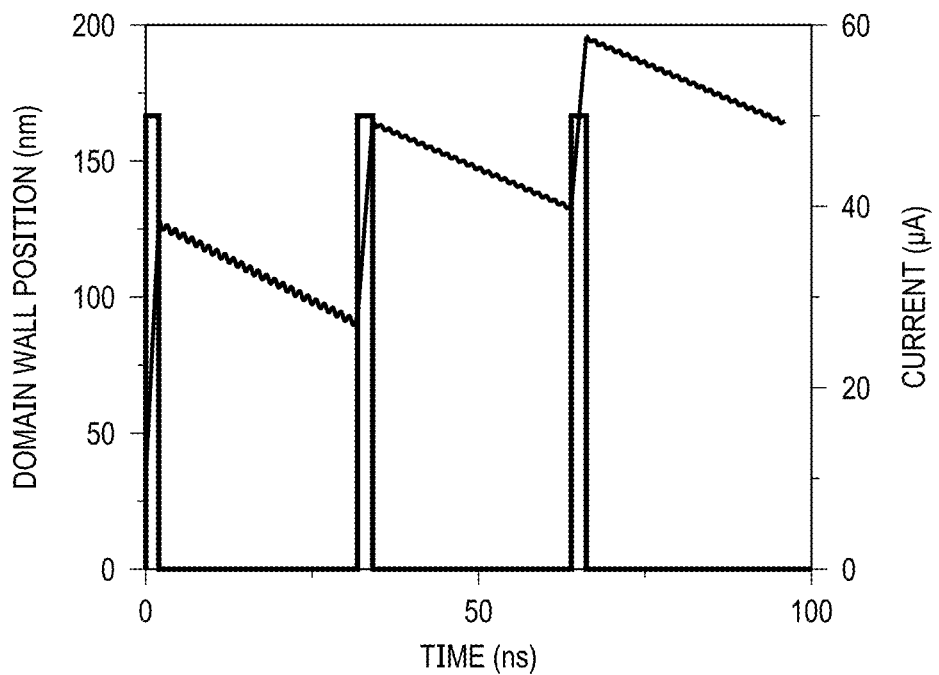
FIG. 15A illustrates a graph of combined integration and leaking behavior of the trapezoidal neuron in accordance with an illustrative embodiment.
Figure 15B:
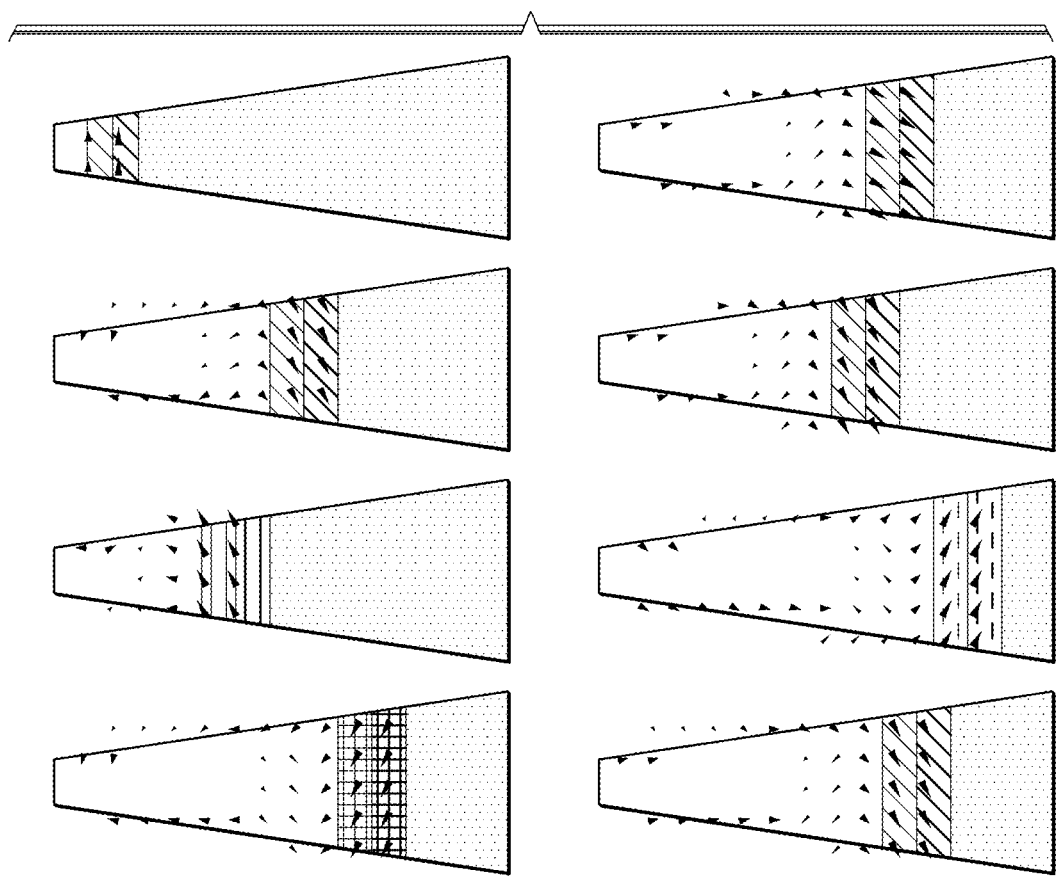
FIG. 15B illustrates snapshots of combined integration and leaking behavior of the trapezoidal neuron in accordance with an illustrative embodiment.

FIG. 15 illustrates combined integration and leaking behavior of the trapezoidal neuron in accordance with an illustrative embodiment. FIG. 15A shows applied current and DW position as a function of time, demonstrating the leaking and integrating functionalities of the neuron. A 2 ns period of integration with a 50 µA current is followed by a 30 ns period of leaking during which no current flows through the ferromagnetic track. This pattern repeats twice for a total runtime of 96 ns. As can be seen in the simulation results, the DW position increases rapidly when current is applied during the integration periods, and precesses while decreasing gradually when leaking in the absence of any external stimuli. FIG. 15B shows micromagnetic simulation snapshots for: (b) t=0, (c) t=2 ns, (d) t=17 ns, (e) t=32 ns, (f) t=34 ns, (g) t=64 ns, (h) t=66 ns, and (i) t=96 ns.

In an LIF neuron, the firing commences when enough energy has been stored in the neuron. In the case of the proposed 3T-MTJ neuron, firing occurs when the DW has passed underneath the tunnel barrier and fixed ferromagnet, switching the MTJ from its high-resistance state to its low-resistance state. This state change can provide a voltage pulse that can be used as an output spike that provides a current pulse to downstream synapses and neurons.

Figure 16:
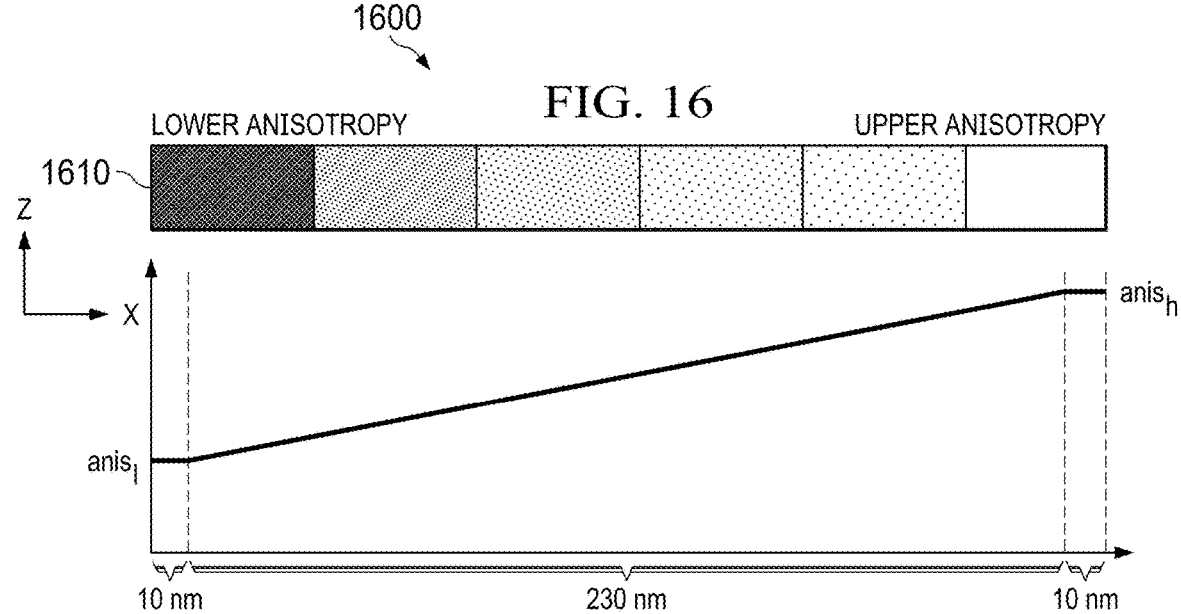
FIG. 16 illustrates a 3T-MTJ device with a graded-anisotropy ferromagnetic track in conjunction with an illustrative embodiment.

FIG. 16 illustrates a three-terminal, magnetic tunnel junction (3T-MTJ) device with a graded-anisotropy ferromagnetic track in conjunction with another illustrative embodiment. The 3T-MTJ device 1600 is similar in cross-section structure to devices 500 and 1200 shown in FIGS. 5A and 12A. However, in this embodiment instead of having a single uniaxial anisotropy value, the ferromagnetic track 1610 has a linearly graded uniaxial anisotropy value as shown in FIG. 16, wherein the anisotropy is oriented along the z-axis. Such a device can be implemented by irradiating the track 1610 with Ga+ ions or using a TaOx wedge placed on top of the track.

Micromagnetic simulations were performed using MuMax. The length L of the device is 250 nm, the width w of the device is 32 nm, and the thickness t of the device is 1.5 nm. The magnetic cells are 1×1×1.5 nm$^3$. The regions of frozen spin on either end of the DW track are 10 nm each, allowing for a 230 nm range of motion for the DW. The exchange stiffness $A_{ex}$ is $1.3 \times 10^{-11}$ J/m, the Landau-Lifshitz-Gilbert damping constant α is 0.02, the non-adiabaticity factor ξ is 0.2, and the magnetic saturation $M_{sat}$ is 800*103 A/m. Since no external excitation is applied to the device, the external magnetic field $B_{ext}$ is 0 T. The DW itself is a Néel type domain wall.

The difference in anisotropy values creates a gradient of DW energies along the nanowire track, as regions of higher anisotropy correspond to a higher-energy state of the DW than regions of lower anisotropy. Therefore, with no external excitation applied to the device, the energy difference between regions of different anisotropies causes the DW to shift from the region of higher anisotropy to the region of lower anisotropy. It should be noted that a DW energy gradient along the nanowire track can be created by means other than anisotropy. Any type of nonuniform material property within the ferromagnetic DW track can be used to create the energy gradient.

Figure 17A:
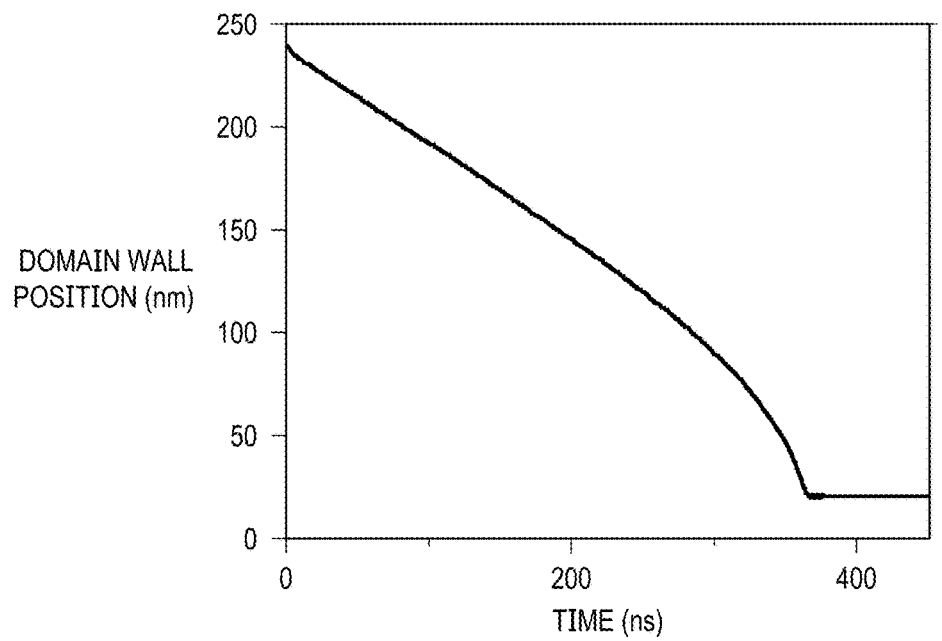
FIG. 17A illustrates a graph of DW position as a function of time in the absence of external stimuli in accordance with an illustrative embodiment.
Figure 17B:
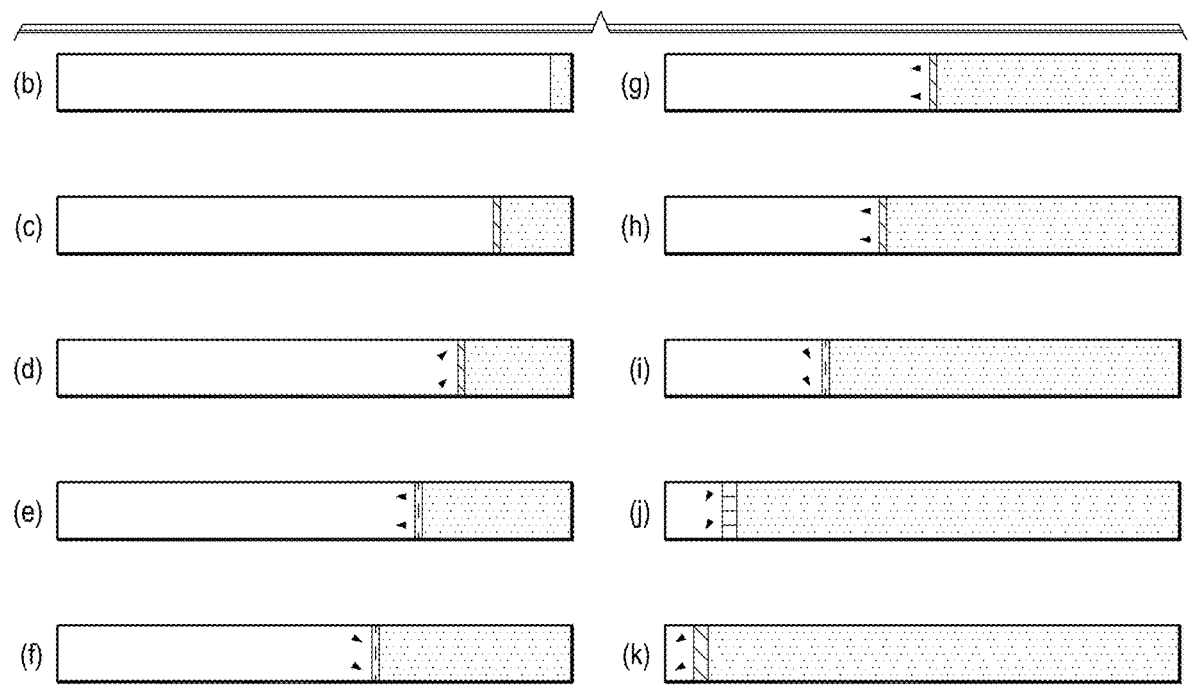
FIG. 17B illustrates snapshots of DW position as a function of time in the absence of external stimuli in accordance with an illustrative embodiment.

FIG. 17 illustrates leaking domain wall motion in the absence of external stimuli in accordance with an illustrative embodiment. FIG. 17A shows DW position as a function of time. After using a current to initialize the DW ~240 nm from the left end of the device (~10 nm from the right end of the device), the DW is allowed to gradually shift to the left end of the device. The DW reaches a steady state ~20 nm from the left end of the track. For this simulation, the lower anisotropy value is $0.5 \times 10^6$ J/m$^3$ and the upper (larger) anisotropy value is $5 \times 10^6$ J/m$^3$. In comparison, Co has an anisotropy of ~$0.4 \times 10^6$ J/m$^3$. FIG. 17B show snapshots from the micromagnetic simulation for: (b) t=0, (c) t=45 ns, (d) t=90 ns, (e) t=135 ns, (f) t=180 ns, (g) t=225 ns, (h) t=270 ns, (i) t=315 ns, (j)=360 ns, and (k) t=405 ns.

Figure 18A:
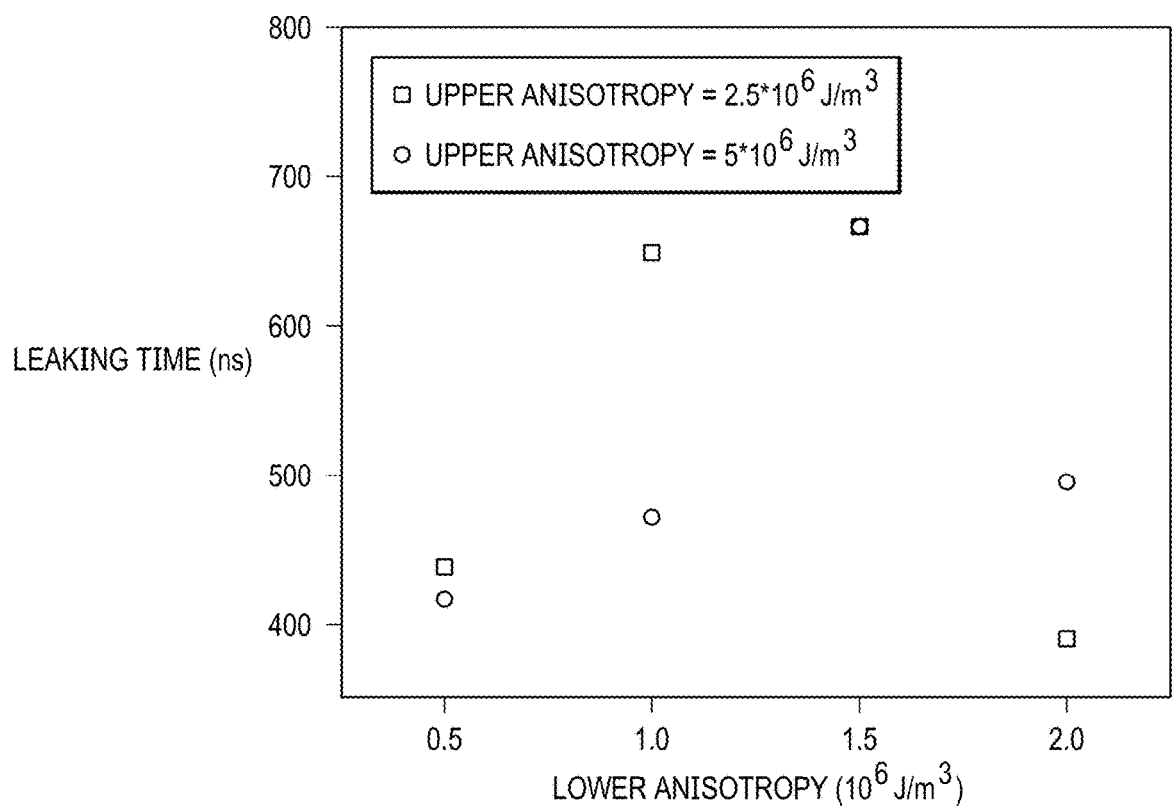
FIG. 18A illustrates a graph depicting leaking time induced by graded anisotropy dependent on lower and upper anisotropy values in accordance with an illustrative embodiment.
Figure 18B:
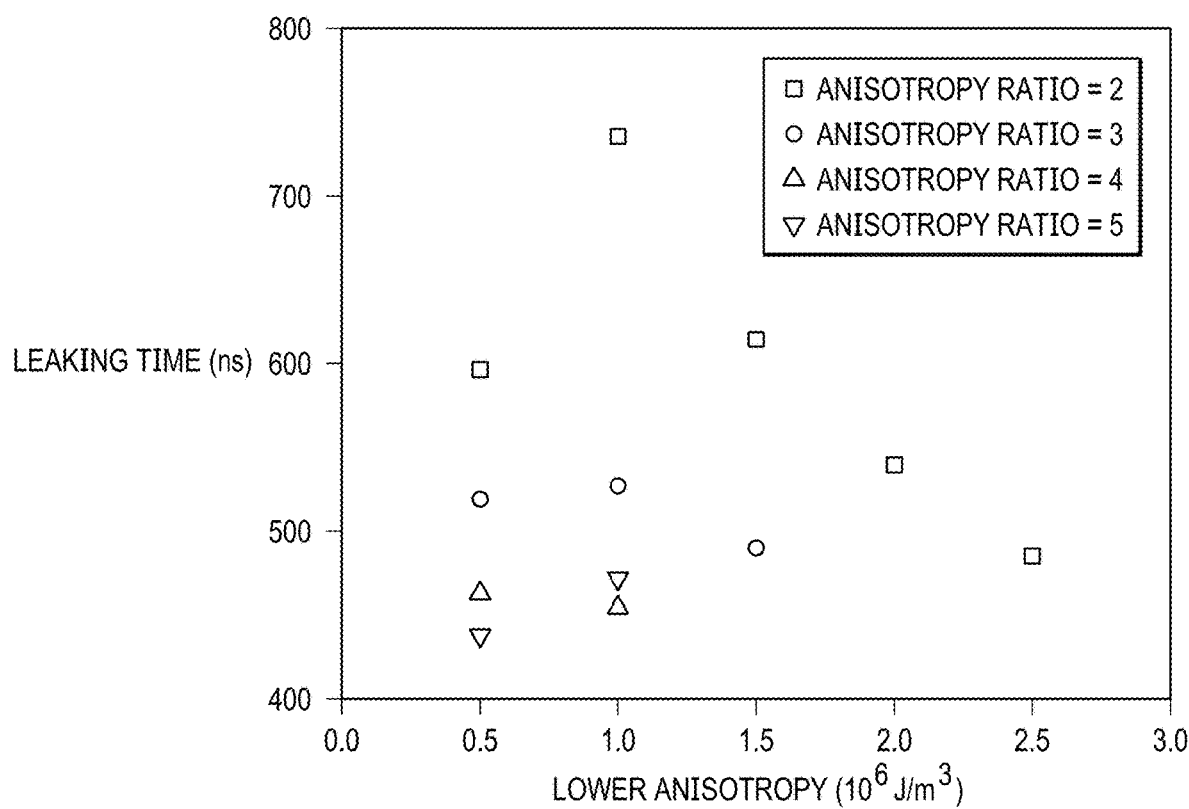
FIG. 18B illustrates a graph depicting leaking time induced by graded anisotropy dependent on the ratio between the lower and upper anisotropy values in accordance with an illustrative embodiment.

FIG. 18 illustrates motion induces by graded anisotropy for a wide variety of values and ratios in accordance with an illustrative embodiment. FIG. 18A shows the leaking time (the time taken for the DW to leak from one end of the track to the other) dependent on both the lower and upper anisotropy values. In general, as the ratio between the lower and upper anisotropy values increases the leaking time decreases, as shown in FIG. 18B.

The leaking time, however, is not solely dependent on the ratio of the upper to lower anisotropy values, but also on the anisotropy values themselves. While holding the anisotropy ratio at 2, increasing the lower anisotropy from $0.5 \times 10^6$ J/m$^3$ to $1 \times 10^6$ J/m$^3$ will cause the leaking time to increase, since the DW motion is hindered by the larger anisotropy. However, when increasing the lower anisotropy even further, the energy difference between regions with higher anisotropy and regions with lower anisotropy is large enough to counteract this effect. Additionally, within a certain range of anisotropy values, a precessional phenomenon similar to Walker breakdown occurs. If an extreme excitation— whether it is a current or an anisotropy gradient—within the appropriate range is applied to the device, an increase in the excitation will actually decrease the average velocity of the domain wall.

Since previous spintronic neurons used external currents, external magnetic fields, and even extra device layers, a 3T-MTJ device with graded anisotropy can be used to implement an LIF neuron with simpler hardware and fabrication requirements than previous LIF neurons. The integration and firing mechanisms remain the same as previous work.

A current passed through the DW track is integrated via the motion of the DW. As the DW shifts from regions of lower anisotropy to regions of higher anisotropy, the energy of the DW increases, causing the state of the neuron to change as well.

Figure 19A:
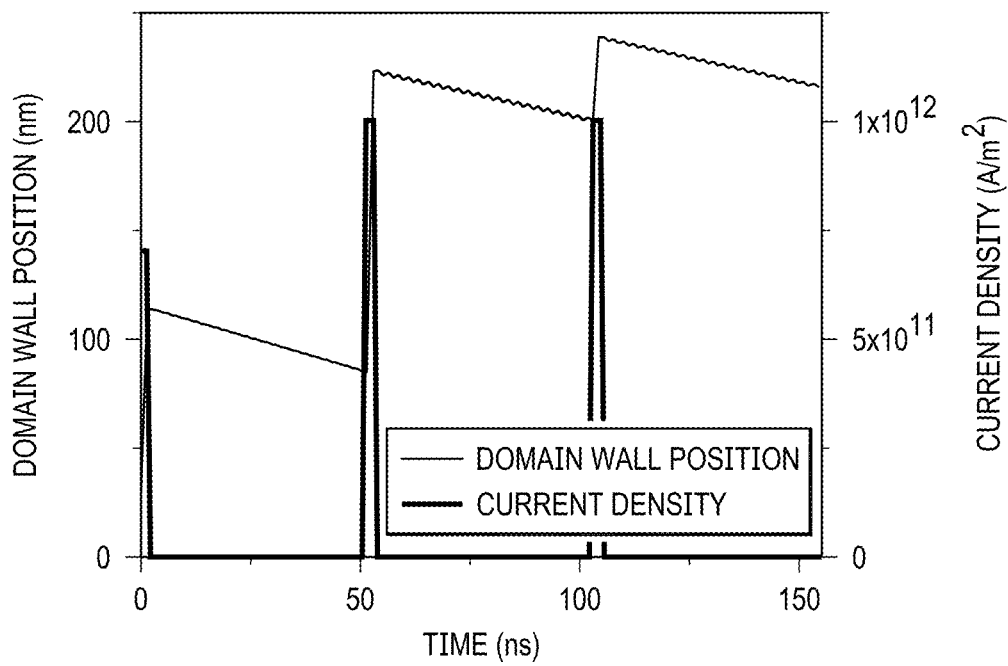
FIG. 19A illustrates a graph depicting the combined integrating and leaking functionalities of a graded-anisotropy device in accordance with an illustrative embodiment.
Figure 19B:
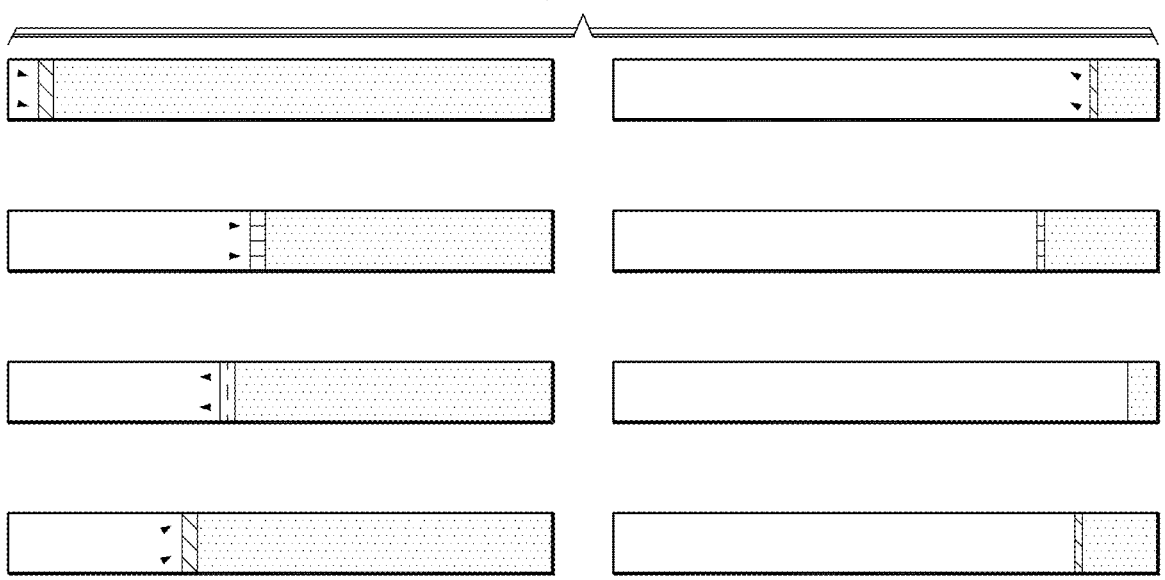
FIG. 19B illustrates snapshots depicting the combined integrating and leaking functionalities of a graded-anisotropy device in accordance with an illustrative embodiment.

FIG. 19 illustrates the combined integrating and leaking functionalities of the graded-anisotropy device in accordance with an illustrative embodiment. FIG. 19A shows DW position and current vs time graph demonstrating the leaking and integrating functionalities of the neuron. The lower anisotropy value is $5 \times 10^5$ J/m$^3$ and the upper anisotropy value is $50 \times 10^5$ J/m$^3$. A 2 ns pulse of $10^{12}$ A/m$^2$ is applied to the device, followed by a 50 ns leaking period. This process repeats twice, resulting in a total run time of 156 ns. During integration, the DW position shifts rapidly, and during leaking with no external stimuli, the DW precesses, as can be seen by the ripple in the DW position. FIG. 19B show snapshots from micromagnetic simulation for: (b) t=0, (c) t=2 ns, (d) t=27 ns, (e) t=52 ns, (f) t=54 ns, (g) t=104 ns, (h) t=106 ns, (i) t=156 ns.

In a standard LIF neuron, the neuron will produce an output spike once enough energy is stored. For the 3T-MTJ neuron, the output spike will be produced when the DW passes underneath the MTJ, switching the resistance state of the device from HRS to LRS. This will allow the use of a voltage pulse to reset the device and produce an output spike.

Figure 20:
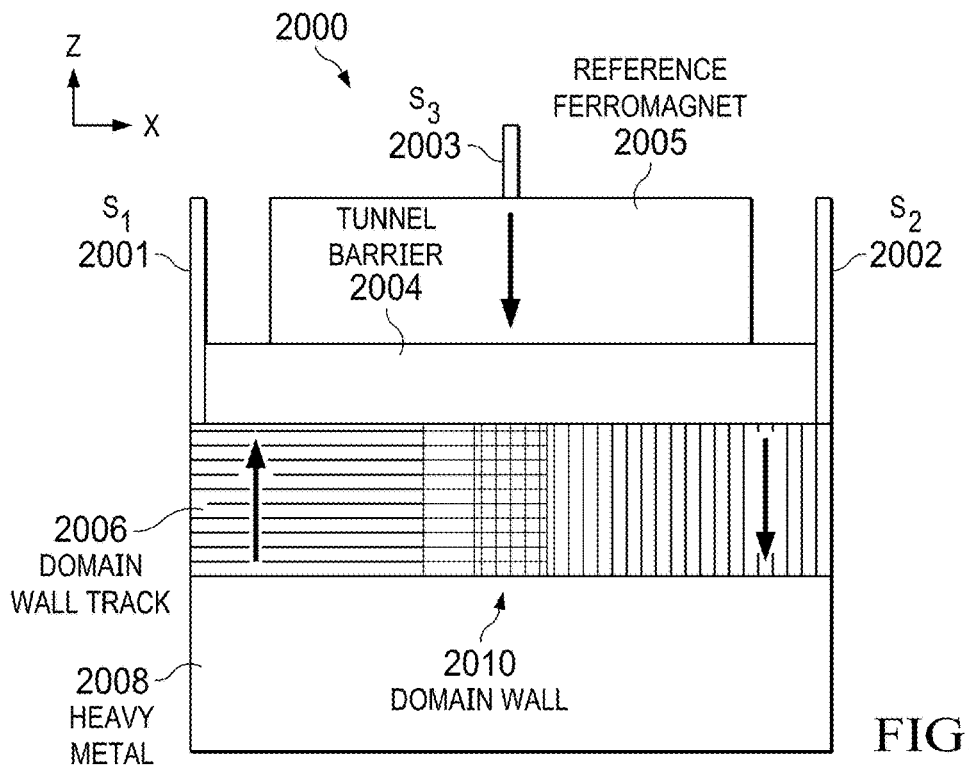
FIG. 20 illustrates a three-terminal DW-MTJ synapse with which illustrative embodiments can be implemented.

FIG. 20 illustrates a three-terminal DW-MTJ synapse with which illustrative embodiments can be implemented. Synapse 2000 might be an example of synapses 410 shown in FIG. 4.

The DW-MTJ based synapse 2000 comprises a single 3T-MTJ device that operates under similar principles as DW-MTJ neurons explained above. However, in contrast to DW-MTJ neurons, the synapse 2000 comprises a longer tunnel barrier 2004 that covers a larger portion of the DW track 2006, allowing the synapse 2000 to exhibit analog resistance states.

A DW track 2006 is placed over a heavy metal layer 2008. A fixed reference ferromagnetic layer 2005 of the synapse device 2000 is extended over the domain wall track 2006 to allow for a continuum of resistance states, wherein the resistance of the device is determined by the position of the DW 2010. Terminal $S_1$ 2001 and terminal $S_2$ 2002 are conductively attached to domain wall track 2006 on opposing ends of the domain wall track. Terminal $S_3$ 2003 is conductively attached to reference ferromagnet 2005.

The position of the DW 2010 is set or modified via a write current applied between terminals $S_2$ and $S_1$ during training to program the resistance state of the synapse 2000. The MTJ conductance can be represented as a parallel-resistance combination of parallel and anti-parallel (with respect to fixed ferromagnet 2005) portions of the DW-MTJ. A positive $S_2$-$S_1$ current grows the anti-parallel +z domain and decreases the conductance of the DW-MTJ. A negative $S_2$-$S_1$ current grows the parallel –z domain and increases the conductance of the DW-MTJ. In the example shown in FIG. 20, if the DW 2010 is on left side of the DW track 2006, the MTJ resistance is low. If the DW 2010 is on the right side of the track, the MTJ resistance is high.

During operation, small voltages from the corresponding input neuron read the resistance state of the device. When the MTJ resistance is low, the connectivity between the synapse and the corresponding output neuron is high, and the output current from the synapse is high. Conversely, when the MTJ resistance is high, the connectivity between the synapse and the corresponding output neuron is low, and the output current from the synapse is low.

Three-terminal DW-MTJ synapse 2000 is capable of providing an analog conductance element to a neural system. The variable MTJ resistors define the weighted connections of a weight matrix. Weight tuning is performed by changing the conductance of the synapses and is referred to as "learning" when the tuning is conducive to the optimization of an objective function for which a cognitive task is defined (e.g., face recognition). In some embodiments, the three-terminal DW-MTJ device is located at the intersection of a word line and a bit line defining the connectivity between an input and output neuron. The weight matrix is formed by a collection of synapses, the output neurons receiving the product of vector matrix multiplication between an input vector and the weight matrix. Cascading multiple crossbar arrays results in a hardware implementation of a multi-layer perceptron.

Figure 21:
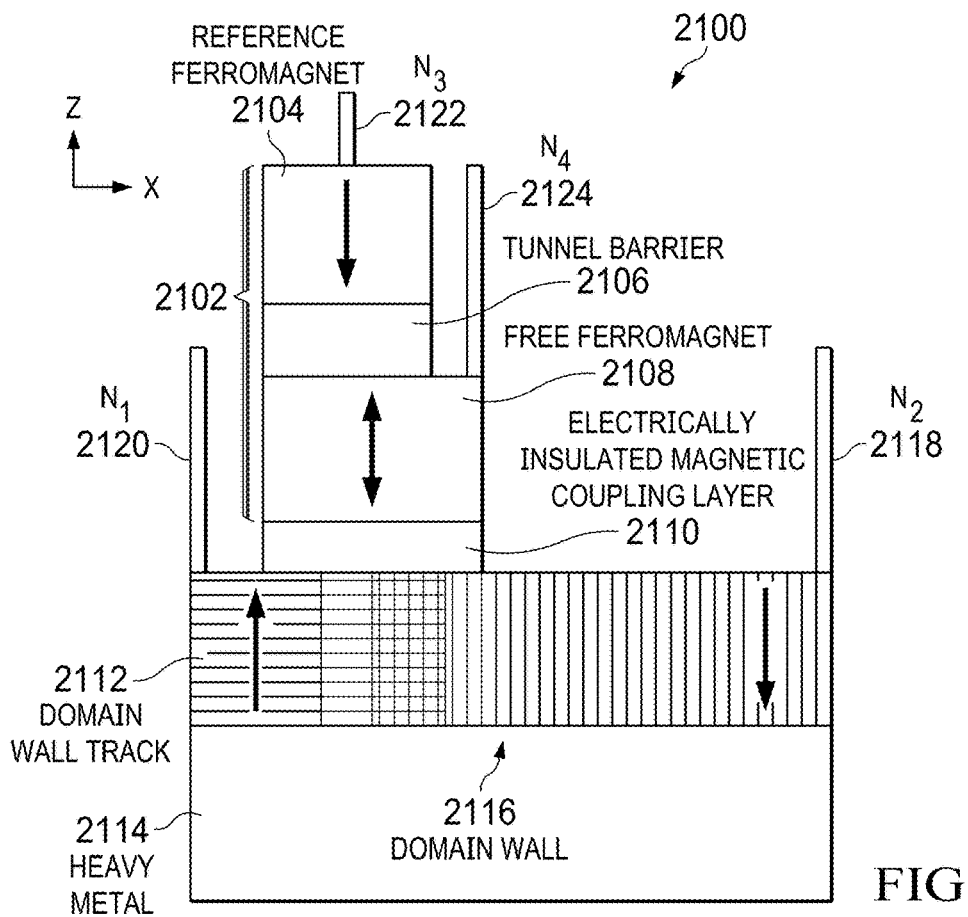
FIG. 21 illustrates a four-terminal DW-MTJ neuron in accordance with an illustrative embodiment.

FIG. 21 illustrates a four-terminal DW-MTJ neuron in accordance with an illustrative embodiment. Four-terminal LIF neuron 2100 operates in principle similarly to three-terminal neuron 500 in FIG. 5A. However, to avoid electrical connectivity between the input and output ports of the neuron, an additional free ferromagnet layer 2108 and magnetic coupling layer 2110 are placed between the tunnel barrier 2106 and DW track 2112.

The four-terminal DW-MTJ device 2100 comprises a soft ferromagnetic track 2112, within which a DW 2116 moves, positioned over a heavy metal layer 2114. Terminal $N_1$ 2120 and terminal $N_2$ 2118 at opposite ends contain the DW 2116 within the track 2112.

An MTJ 2102 is positioned over the DW track 2112, between terminal $N_2$ 2118 and terminal $N_1$ 2120. MTJ 2102 comprises fixed reference ferromagnet 2104, tunnel barrier 2106 beneath the fixed ferromagnet 2104, and free ferromagnet 2108 beneath tunnel barrier 2106. Electrically insulated, magnetic coupling layer 2110 between free ferromagnet 2108 and DW track 2112 electrically isolates MTJ 2102 from DW track 2112.

When sufficient current flows through DW track 2112 between terminal $N_2$ 2118 and terminal $N_1$ 2120, DW wall 2116 shifts leftward (in this view) toward terminal 2120. As with the other embodiments, in the absence of sufficient signal integration, DW 2116 will drift rightward back toward terminal 2118 due to an energy gradient (created by any of the methods described above).

When the DW 2116 passes underneath the electrically isolated MTJ 2102, the free ferromagnet layer 2108 of MTJ 2102 reorients its magnetization due to dipole coupling, thereby changing the resistance state of MTJ 2102. This magnetization switch in free ferromagnet 2108, in combination with a voltage applied to third terminal $N_3$ 2122, results in current output through fourth terminal $N_4$ 2124 (i.e. spike). Therefore, four-terminal DW-MTJ neuron 2100 provides firing functionality without any electrical connectivity between MTJ 2102 and DW track 2112.

In operation, four-terminal DW-MTJ device 2100 performs the leaky integrate-and-fire (LIF) neuronal functionalities. The electrically insulating magnetic coupling layer separates the $N_1$-$N_2$ write current path from the $N_3$-$N_4$ read path. The $N_3$-$N_4$ path has an MTJ of smaller dimension compared to the synapse MTJ. Spin-transfer torque inducing current through the $N_1$-$N_2$ path performs integration by moving the DW in the right-to-left direction. Leaking causes the DW to move in the left-to-right direction and can be performed by one of the other approaches presented herein: dipolar coupling field (FIG. 7), anisotropy gradient along the DW track (FIG. 16), and shape variation of the DW track (FIG. 13). When the DW crosses beneath the dipolarly-coupled free ferromagnet during the integration process, the MTJ between the $N_3$-$N_4$ path switches from an anti-parallel, low conductive state to a parallel, high conductive state, thereby implementing a binary MTJ resistance and performing the firing functionality.

Figure 22:
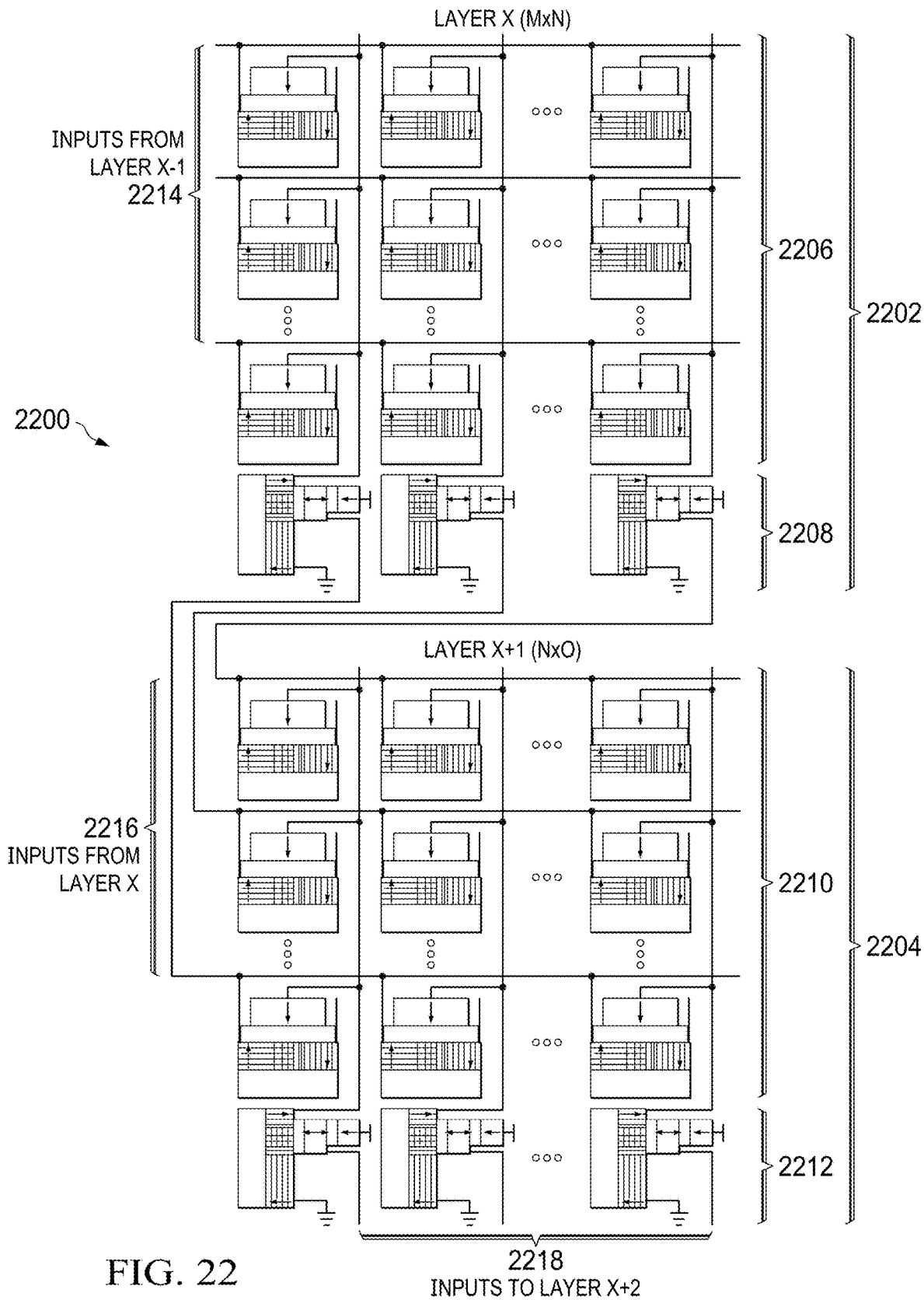
FIG. 22 illustrates a CMOS-free, multi-layer spintronic neural network in accordance with an illustrative embodiment.

FIG. 22 illustrates a CMOS-free, multi-layer spintronic neural network in accordance with an illustrative embodiment. Neural network 2200 comprises multiple layers of synapses and neurons. In the example shown, only two layers 2202, 2204 are illustrated, but it should be understood that network 2200 might comprise more than two layers.

In the example in FIG. 22, layer X 2202 comprise an M×N crossbar of synapses 2206 and four-terminal DW-MTJ neurons 2208. Similarly, the next layer X+1 2204 comprises an N×O crossbar of synapses 2210 and neurons 2212. Synapses 2206 and 2210 might comprise DW-MTJ synapses such as synapse 2000 shown in FIG. 20. Neurons 2208 and 2212 might comprise four-terminal DW-MTJ neurons such as neuron 2100 shown in FIG. 21.

Inputs 2214 into layer X 2202 might be outputs from a previous layer (X−1). Synapses 2206 might be programmed (trained) to provide respective weights to inputs 2214, which in turn affects how signals integrate in neurons 2208. In an embodiment, only one of neurons 2208 might fire due to lateral inhibition (explained above) in a winner-take-all manner in response to inputs 2214.

Outputs from layer X 2202 then serve as inputs 2216 into layer X+1 2204, which in turn might produce inputs 2218 to the next layer (X+2) in network 2200.

The electrical isolation provided by the electrically insulated, magnetic coupling layer 2110 in the four-terminal DW-MTJ neurons 2208, 2212 enables spintronic network 2200 to operate without complementary metal-oxide-semiconductors (CMOS), in contrast to other spintronic neural networks that require significant CMOS circuitry in order to interconnect the layers, implement leaking, and provide lateral inhibition.

The electrical isolation of the four-terminal DW-MTJ neurons 2208, 2212 allows the M×N crossbar layer of synapses 2206 to be connected to an N×O crossbar layer of synapses 2210 while maintaining unidirectional signal flow due to the output signals coming from electrically isolated free ferromagnets (i.e. 2108). This CMOS-free spintronic architecture can be extended to deep neural networks with numerous layers with a more simplified fabrication in comparison to CMOS-dependent networks.

The process of updating weights in a neural network is called learning. Depending on the presence of a teacher signal, learning can be classified into the categories of supervised, unsupervised, and semi-supervised methods. In another aspect of the present invention, a primitive circuit for unsupervised learning is further disclosed as will be shown in reference to FIGS. 23, 24 and 25. Without limitation, this primitive circuit can be co-integrated with other learning sub-systems. The present invention implements unsupervised learning as an electrical approximation of Hebbian (associative) learning, which can be efficiently implemented via the spike-timing dependent plasticity (STDP) rule. This rule can efficiently extract information from real-time data, such as images, video, or other raw sensor data.

Figure 23A:
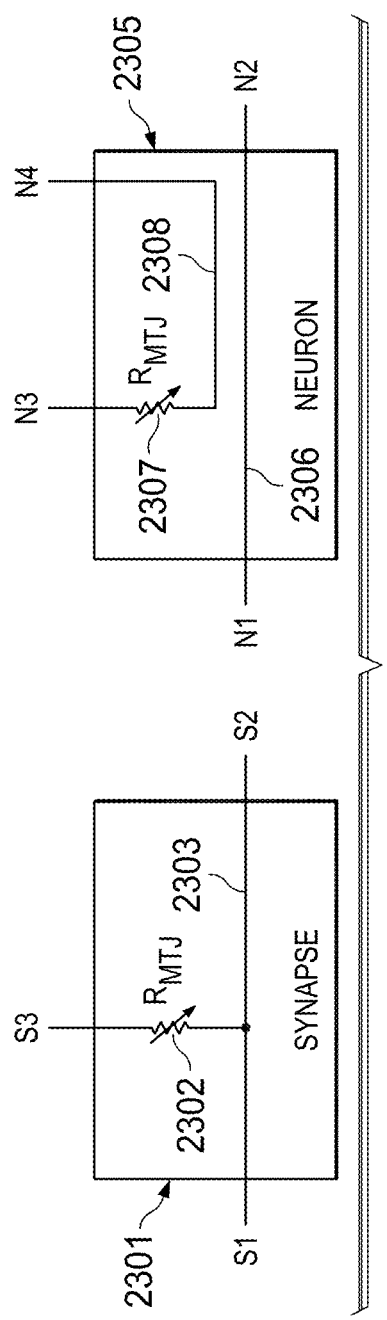
FIG. 23A illustrates an electrical equivalent of a DW-MTJ synapse and neuron connecting circuit in accordance with an illustrative embodiment.

FIG. 23A shows the electrical equivalents of the DW-MTJ synapse 2000 and neuron 2100 discussed above. Synapse 3201 is the electrical equivalent of synapse 2000, and neuron 2305 is the electrical equivalent of neuron 2100. The synapse 2301 comprises analog variable resistor RMTJ 2302 in the $S_1$-$S_3$ path and a conducting wire 2303 in the $S_1$-$S_2$ path. Conducting wire 2303 represents the DW track which has a negligible resistance compared to the resistance of RMTJ 2302. Neuron 2305 comprises a conducting wire 2306 in the $N_1$-$N_2$ path representing the DW track and a binary resistor RMTJ 2307 in the $N_3$-$N_4$ path 2308. The electrical isolation between the $N_1$-$N_2$ and $N_3$-$N_4$ paths results from the electrically insulated magnetic coupling layer.

Figure 23B:
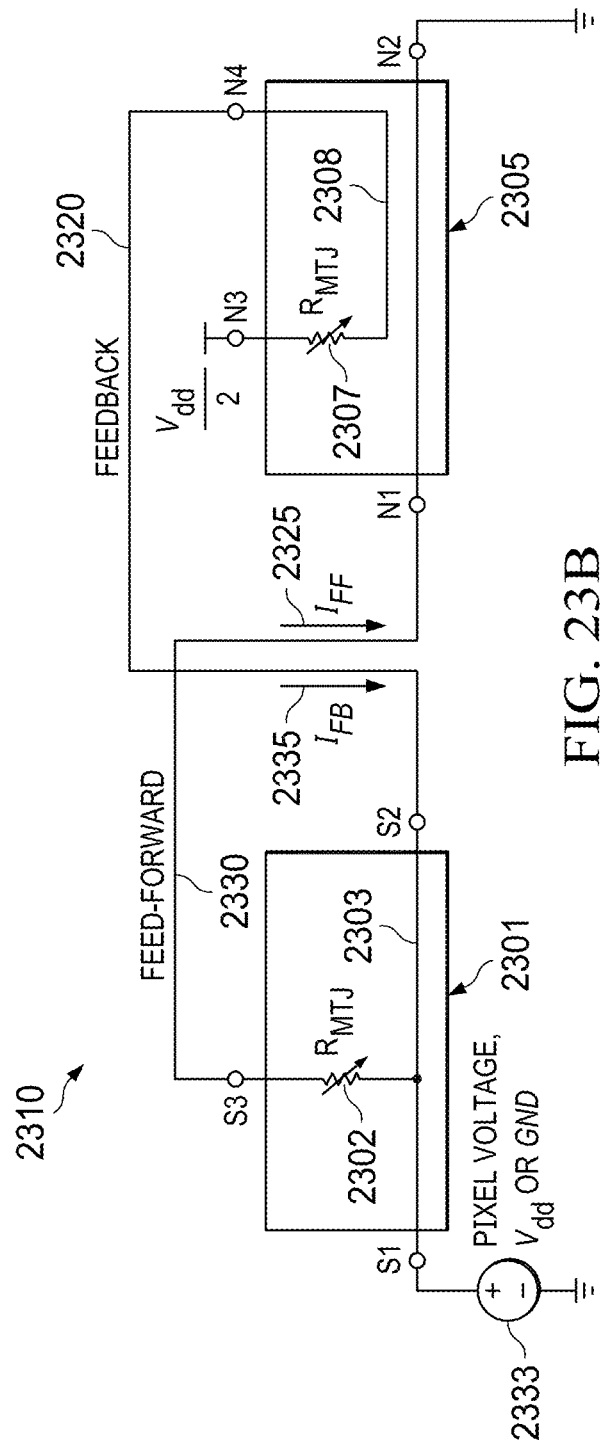
FIG. 23B illustrates a neuron-synapse connection underlying inference and learning mechanisms in accordance with an illustrative embodiment.

FIG. 23B illustrates neuron-synapse connection 2310 underlying the inference and learning mechanisms. A synapse is generally connected between an input pattern source and a post-synaptic neuron. A portion of an input pattern (e.g., an image pixel) can be measured and converted into an input voltage 2333 representing binary 0 and 1 inputs corresponding to voltage levels Gnd and $V_{dd}$, respectively. In another embodiment, the input voltage 2333 can be analog representing the grayscale, and can be represented by an analog voltage between Gnd and $V_{dd}$. Input voltage 2333 is connected to the $S_1$ terminal of the synapse, and a feed-forward connection is made between the $S_3$ terminal of synapse 2301 and $N_1$ terminal of neuron 2305. A feed-forward current 2325 ($I_{FB}$) flows through the $S_1$-$S_3$-$N_1$-$N_2$ path 2330. Feed-forward current 2325 is modulated by analog variable resistor RMTJ 2302 of the synapse 2301 and results in an integration process of the post-synaptic neuron 2305.

Learning is performed by a feedback connection established between the $N_4$ and $S_2$ terminals. A feedback current 2335 ($I_{FB}$) flows through the $N_3$-$N_4$-$S_2$-$S_1$ path 2320 and is modulated by the binary resistor RMTJ 2307 in the $N_3$-$N_4$ path 2308. The $N_3$ terminal is connected to voltage level Vdd/2.

$I_{FB}$ feedback current 2335 has a positive value if the input voltage connected to the $N_1$ terminal is Gnd. A positive $I_{FB}$ feedback current through the $S_2$-$S_1$ path 2303 decreases the synaptic analog conductance of RMTJ 2302 connected in the $S_1$-$S_3$ path.

$I_{FB}$ feedback current 2335 has a negative value if the input voltage connected to the $N_1$ terminal is Vdd. A negative $I_{FB}$ current through the $S_2$-$S_1$ path 2303 increases the synaptic analog conductance of RMTJ 2302 connected in the $S_1$-$S_3$ path.

The conductance update summary is provided in Table I, wherein the conductance of synapse 2301 changes only when the post-synaptic neuron 2305 fires. Binary resistor RMTJ 2307 connected between $N_3$-$N_4$ controls the rate of the learning mechanism. For a firing neuron, binary resistor RMTJ 2307 provides a high conductance and results in a higher value of $I_{FB}$ feedback current 2335 and higher learning rate. For a non-firing neuron, binary resistor RMTJ 2307 provides a low conductance and results in a lower value of $I_{FB}$ feedback current 2335 and lower learning rate.

TABLE I

LEARNING CIRCUIT SUMMARY

| Input/Pixel Voltage | $I_{FB}$(S2-S1) | Synapse Conductance |
|---|---|---|
| Gnd | Positive | Decreases |
| $V_{dd}$ | Negative | Increases |

Figure 24:
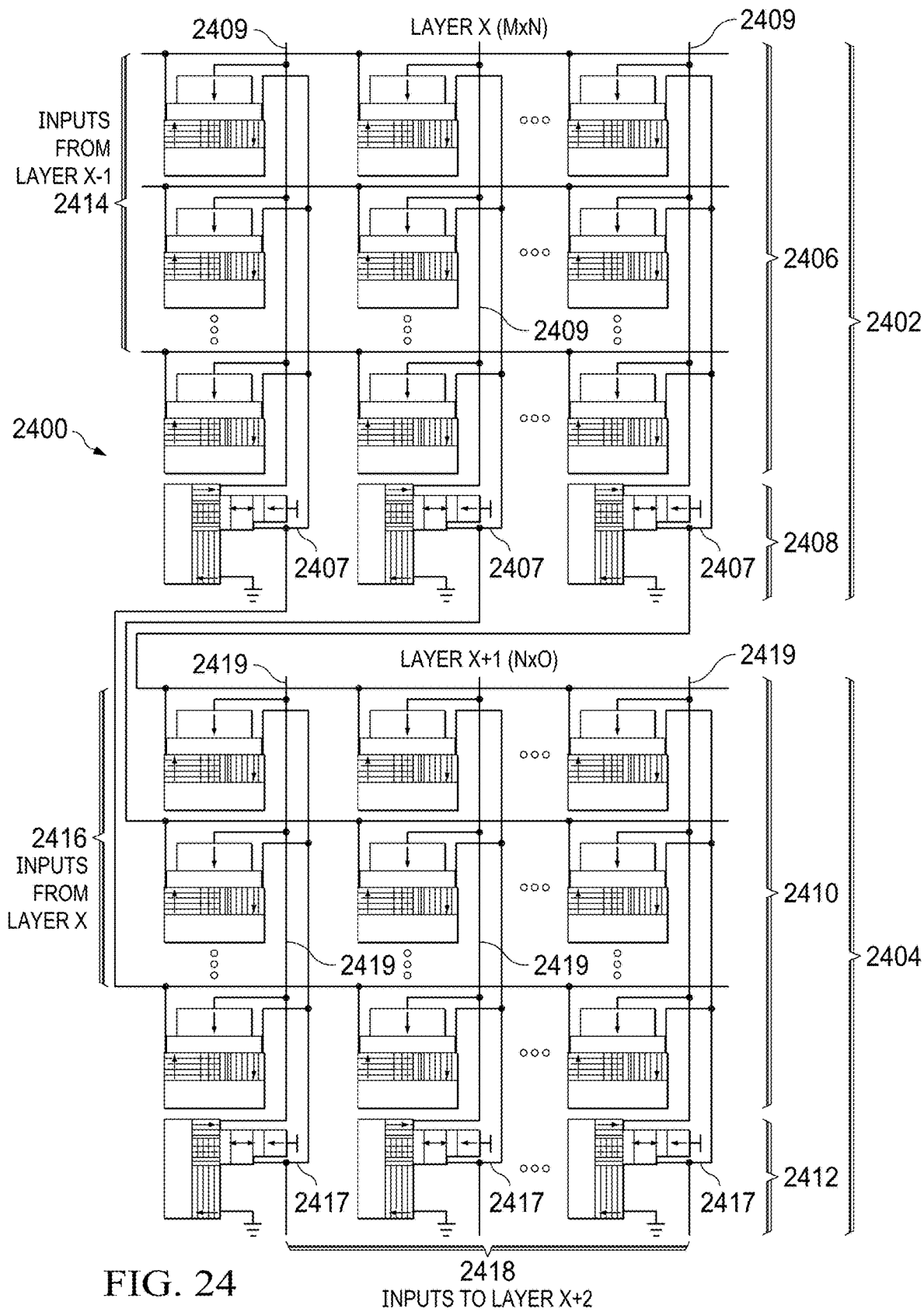
FIG. 24 illustrates a CMOS-free, multi-layer spintronic neural network suitable for unsupervised learning in accordance with an illustrative embodiment.

FIG. 24 illustrates a proposed DW-MTJ multi-layer spintronic neural network with feedback connections from 4-terminal DW-MTJ neurons to 3-terminal DW-MTJ synapses in order to perform unsupervised learning. Input signals are provided to the left terminals of the synapses. Electrical signals flow across the tunnel barrier to the central terminal of each synapse, eventually reaching the connected output neuron. The current flowing across each synapse tunnel barrier is a function of the DW position, and therefore, the synaptic weight encoded in the conductance of the DW-MTJ. The weighted current fed into the $N_1$ terminal of the output neuron performs LIF functionalities by modulating its DW position. The feedback operation to perform unsupervised learning is achieved by connecting the $N_4$ terminal of the output neuron to the right terminals of the synapses connected to the neuron's $N_1$ terminal.

FIG. 24 illustrates a CMOS-free, multi-layer spintronic neural network in accordance with another illustrative embodiment. Neural network 2400 comprises multiple layers of synapses and neurons. In the example shown, only two layers 2402, 2404 are illustrated, but it should be understood that network 2400 might comprise more than two layers.

In the example in FIG. 24, layer X 2402 comprises an M×N crossbar of synapses 2406 and four-terminal DW-MTJ neurons 2408. Similarly, the next layer X+1 2404 comprises an N×O crossbar of synapses 2410 and neurons 2412. Synapses 2406 and 2410 might comprise DW-MTJ synapses such as synapse 2000 shown in FIG. 20. Neurons 2408 and 2412 might comprise four-terminal DW-MTJ neurons such as neuron 2100 shown in FIG. 21.

Inputs 2414 into layer X 2402 might be outputs from a previous layer (X−1). Synapses 2406 might be programmed (trained) to multiply respective weights by inputs 2414, which in turn affects how signals integrate in neurons 2408. Feedback connections 2407 provide electrical connectivity between the $N_4$ terminals of neurons 2408 to the $S_2$ terminals of the synapses 2406 in the same column. Feed-forward connection 2409 provide electrical connectivity between the $S_3$ terminals of the synapses 2406 to the $N_1$ terminals of the neurons 2408 in the same column. Feedback connections 2407 facilitate current $I_{FB}$ and feed-forward connections 2409 facilitate current $I_{FF}$ as described in relation to FIG. 23B.

Outputs from layer X 2402 then serve as inputs 2416 into layer X+1 2404, which in turn might produce inputs 2418 to the next layer (X+2) in network 2400.

Feedback connections 2417 provide electrical connectivity between the $N_4$ terminals of neurons 2412 to the $S_2$ terminals of the synapses 2410 in the same column. Feed-forward connection 2419 provide electrical connectivity between the $S_3$ terminals of the synapses 2410 to the $N_1$ terminals of the neurons 2412 in the same column. Feedback connections 2417 facilitate current $I_{FB}$ and feed-forward connections 2419 facilitate current $I_{FF}$ as described in relation to FIG. 23B.

The electrical isolation provided by the respective electrically insulated, magnetic coupling layers 2110 in the four-terminal DW-MTJ neurons 2408, 2412 enables spintronic network 2400 to operate without complementary metal-oxide-semiconductors (CMOS), in contrast to other spintronic neural networks that require significant CMOS circuitry in order to interconnect the layers, implement leaking, and provide lateral inhibition.

The electrical isolation of the four-terminal DW-MTJ neurons 2408, 2412 allows the M×N crossbar layer of synapses 2406 to be connected to the N×O crossbar layer of synapses 2410 while maintaining unidirectional signal flow due to the output signals coming from electrically isolated free ferromagnets (i.e., 2108).

This CMOS-free spintronic architecture can be extended to deep neural networks with numerous layers with a more simplified fabrication in comparison to CMOS-dependent networks. The spintronic architecture is particularly suitable for unsupervised learning.

The behavior of DW-MTJ synapses and neurons can be modeled by equations that characterize tunnel barrier conductance as a function of DW position and the motion of DWs as a function of current flow between the left and right terminals. For the synapse s, its conductance Gs at time t is given by equation (1), $$G_s^t = \frac{x_s^t}{W_s} G_{AP} + \frac{W_s - x_s^t}{W_s} G_P \in [G_{AP}, G_P] \quad (1)$$

where $x_s^t$ is the position of the synapse DW along the track, $W_s$ is the width of the tunnel barrier, $G_{AP}$ is the antiparallel conductance, and $G_P$ is the parallel conductance.

For consistency with the literature on neural networks, this conductance value can be used to define the weight of the synapse $w_s^t$ as a normalized value between 0 and 1 in equation (2), $$w_s^t = \frac{G_s^t - G_{AP}}{G_P - G_{AP}} \in [0, 1] \quad (2)$$

In the neuron n, the short tunnel barrier ideally produces only binary conductance states characterized by equation (3), $$G_n^t = \begin{cases} G_P & x_n^t < b_n \\ G_{AP} & x_n^t > b_n \end{cases} \quad (3)$$

where $b_n$ is the position of the neuron barrier along the track.

In every synapse s, a current I causes the DW to move from its current position $x_s^t$ to $x_s^{t+1}$ after a time $\Delta T$ in terms of a function $\alpha(x_s^t,I)$, characterized by equation (4), $$x_s^{t+1} = x_s^t + \Delta T \times \alpha(x_s^t,I) \quad (4)$$

In the neuron n, a leaking force L is included such that the DW dynamics are given by equation (5).

$$x_n^{t+1} = x_n^t + \Delta T \times [\alpha(x_n^t,I) - L(x_n^t)] \quad (5)$$

Due to this leaking and the lateral inhibition among nearby neurons, the perceptron system can be designed to ensure that exactly one neuron fires in response to each set of inputs, and that the neurons are reset before the next set of inputs is provided.

Figure 25:
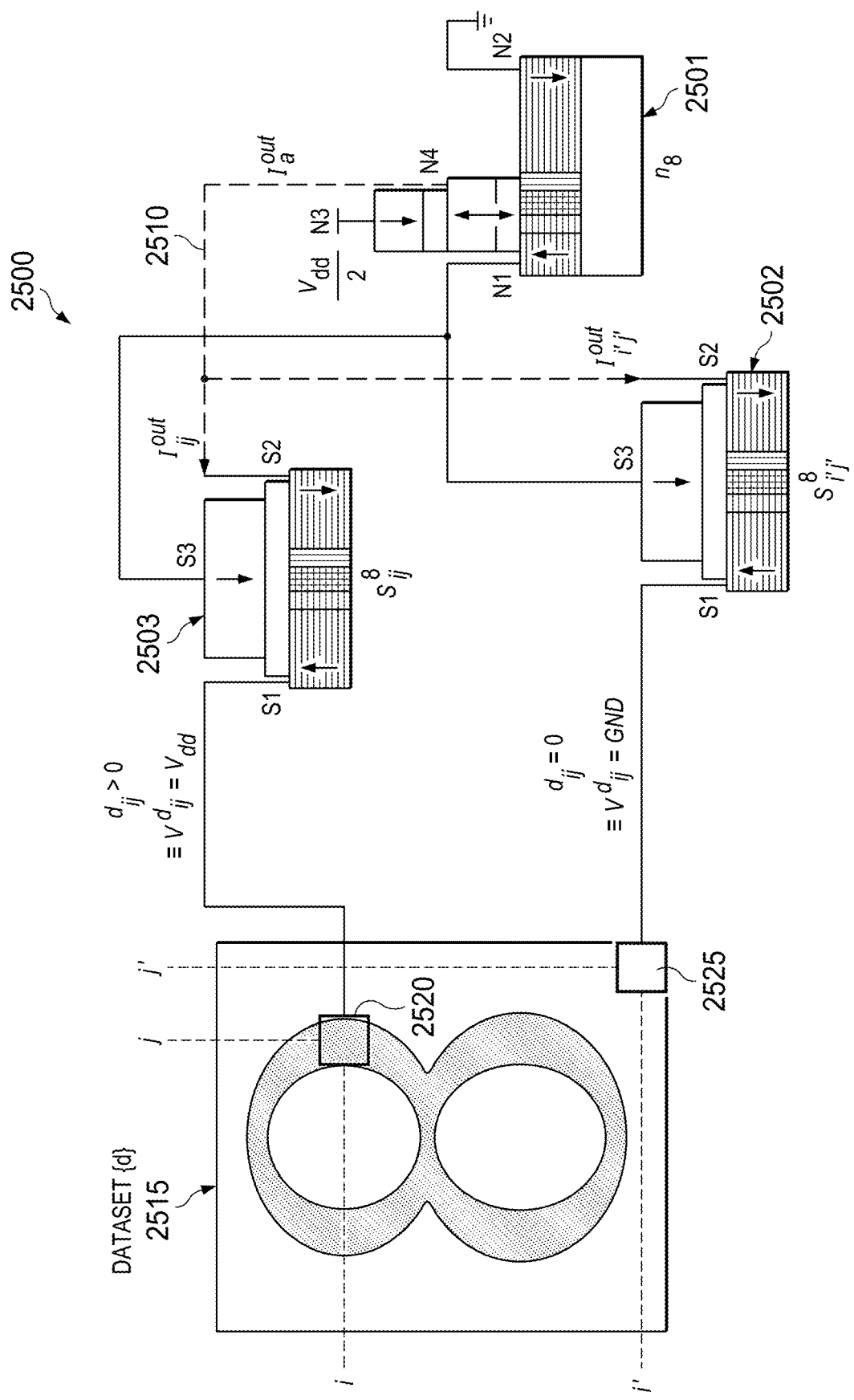
FIG. 25 illustrates connectivity between an input data signal, synapses and neuron in a partial layer of a spintronic neural network in accordance with an illustrative embodiment.

For purposes of illustration, FIG. 25 shows a model of operation constructed for a portion 2500 of a single layer a of a multi-layer spintronic neural network system. The single layer a is electronically connected to an electronic dataset {d} 2515 and has a best-matching neuron 2501 which fires upon recognition of a pattern in the dataset. In the example shown, the dataset {d} 2515 describes an image comprising pixels. In the present example, not all neurons and synapses connected to the dataset are shown in the illustration, just a best-matching portion. The synapse terminals $S_1$-$S_3$ and neuron terminals $N_1$-$N_4$ are as defined in FIGS. 20 and 21, respectively.

Portion 2500 comprises a best-matching neuron 2501 interconnected with a first synapse 2502 and a second synapse 2503. First synapse 2502 is fed a signal representing a single element 2525 (pixel) of dataset 2515. Second synapse 2503 is fed a signal representing a single element 2520 (pixel) of dataset {d} 2515. During training, the output 2510 at terminal $N_4$ of best-matching neuron 2501 is feedback to the respective $S_2$ terminal of every synapse connected to it, i.e., synapses 2502 and 2503. This feedback changes the effective weights of synapses 2502 and 2503 in such a way that synapses which do not contribute to a positive signal 2510, $I_a^{out}$, are weakened and those that do are strengthened.

A clustering algorithm is disclosed for simulating the behavior of a multi-layer spintronic neural network system as described in FIGS. 23-25. In another aspect of the invention, the clustering algorithm can be implemented as a set of program steps which are carried out by a computer processer in a computer system. The resulting computer system is suitable for use as a neural network for machine learning purposes, in particular unsupervised learning.

Figure 26:
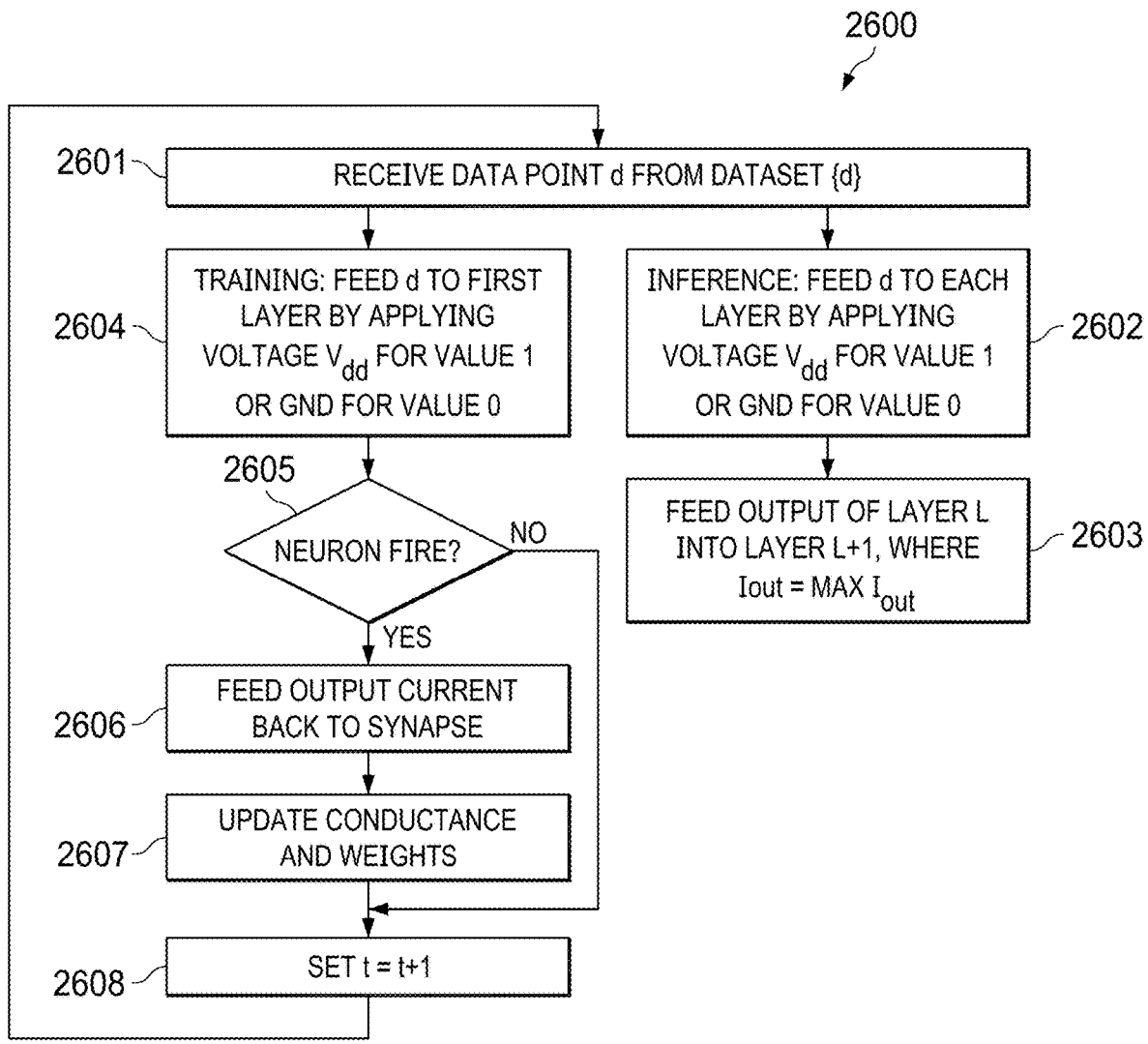
FIG. 26 illustrates a method of operating a spintronic neural network in accordance with an illustrative embodiment.

FIG. 26 illustrates a method of operating a spintronic neural network in accordance with an illustrative embodiment. Process 2600 provides a clustering algorithm for unsupervised learning in network 2400 in FIG. 24 and is applicable to portion 2500 in FIG. 25.

Given m n×n datasets (e.g., images) and x fully connected independent spintronic layers with $n^2$ synapses $s_{ij}^k$ each connected to one output neuron $n_k$, where k is the layer index $k \in [1, \ldots, X]$, process 2600 produces trained synaptic weights such that output neurons act as classifiers by assigning input data to one of x clusters.

For every data point d in a dataset 2515 (e.g., an image), $d_{ij} \in \{0,1\}$ denotes pixel (i,j) (e.g., pixel 2520) as shown in FIG. 25. The steps in process 2600 are applied to each data point $d_{i,j}$ and comprise two phases: training and inference.

During training, each data point d is received (step 2601) and fed to the first layer of the network by applying voltage $V_{dd}$ for a pixel with binary value 1 or by applying voltage Gnd for a pixel with binary value 0 (step 2604).

If a neuron fires (step 2605), the output current $I_{ij}^{out}$ is then used as feedback to the right terminal $S_2$ of synapse $s_{ij}^a$ (step 2606).

The conductance $G_s^{t+1}$ and weights $\omega_s^{t+1}$ of the synapse are updated accordingly (step 2607). Cluster C(t+1) is updated from C(t) according to equation (6), $$x_{s_{ij}^a}^{t+1} = x_{s_{ij}^a}^{t} + \Delta T \times \alpha\left(x_{s_{ij}^a}^{t}, V^{d_{ij}} \in \{Gnd, V_{dd}\}, I_{ij}^{out}\right) \quad (6)$$

If $V^{d_{ij}}$=Gnd, then the feedback current $I_{ij}^{out}$ flows through synapse $s_{ij}^a$ in the right-to-left direction, leading to $$w_{s_{ij}^a}^{t+1} \leq w_{s_{ij}^a}^{t}.$$

That is, the synaptic weight of $s_{ij}^a$ is decreased because this synapse did not contribute to detecting pixel $d_{ij}$.

If $V^{d_{ij}}=V_{dd}$, then the feedback current $I_{ij}^{out}$ flows in the left-to-right direction through the $s_{ij}^a$ synapse, leading to $$w_{s_{ij}^a}^{t+1} \geq w_{s_{ij}^a}^{t}.$$

That is, the synaptic weight of $s_{ij}^a$ is increased because this synapse contributed to detecting pixel $d_{ij}$. Since the neurons are reset after each input, there is no need for concern about the changes in $x_n^{t+1}$, $G_n^{t+1}$ for output neurons.

Time t is incremented, t=t+1, and the process is repeated (step 2608). Process 2600 begins at t=0.

During inference, each data point d is fed to each layer by applying voltage $V_{dd}$ for a pixel with binary value 1 or by applying voltage Gnd for a pixel with binary value 0 (step 2602).

The outputs of each layer L are fed as input to the next layer L+1 (step 2603). Each neuron has an output current. For each layer, there is a neuron with a maximum output current, wherein $I_a^{out} = \max_{k \in \{1, \ldots, x\}} I_k^{out}$ is the largest output current.

A DW-MTJ clustering network 2400 can be combined with an appropriate read-out crossbar array, for example, crossbar array 400. The clustering network 2400 functions as an unsupervised encoder, and the crossbar array 400 functions as a supervised decoder. The decoder portion provides labels to the clusters learned by the encoder. The unsupervised learning circuit will group datasets (e.g., images) into categories for each digit (e.g., 1's, 2's, etc.), but it does not know how to label the categories with the correct digits. The supervised decoder provides the capability to labels the categories. The systems reads spikes from the unsupervised encoder and maps them to the labels provided by the supervised decoder at the output of the system, adjusting conductances following a supervised rule.

As used herein, the phrase "a number" means one or more. The phrase "at least one of", when used with a list of items, means different combinations of one or more of the listed items may be used, and only one of each item in the list may be needed. In other words, "at least one of" means any combination of items and number of items may be used from the list, but not all of the items in the list are required. The item may be a particular object, a thing, or a category.

The description of the different illustrative embodiments has been presented for purposes of illustration and description and is not intended to be exhaustive or limited to the embodiments in the form disclosed. Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A neural network, comprising:
  a crossbar array of domain wall magnetic tunnel junction artificial synapses, each synapse comprising:
    a first ferromagnetic domain wall track within which is a first magnetic domain wall, the ferromagnetic domain wall track having a first fixed magnetization region at a first end and a second fixed magnetization region at a second end, and wherein the second fixed magnetization region has a magnetic direction opposite to the first fixed magnetization region;
a magnetic tunnel junction between the first and second ends of the domain wall track, wherein the magnetic tunnel junction comprises a fixed ferromagnet;
a tunnel barrier beneath the fixed ferromagnet; and the domain wall track beneath the tunnel barrier;
a plurality of domain wall magnetic tunnel junction artificial neurons, each neuron comprising:
a second ferromagnetic domain wall track within which is a second magnetic domain wall, wherein the second ferromagnetic domain wall track has a first fixed magnetization region at a first end and a second fixed magnetization region at a second end, wherein the second fixed magnetization region has a magnetic direction opposite to the first fixed magnetization region, and wherein the domain wall track comprises an energy gradient between the first and second ends;
a magnetic tunnel junction between the first and second ends of the domain wall track, wherein the magnetic tunnel junction comprises a fixed ferromagnet;
a tunnel barrier beneath the fixed ferromagnet;
a free ferromagnet beneath the tunnel barrier; and,
an electrically insulating, magnetic coupling layer between the free ferromagnet and the domain wall track, wherein the free ferromagnet is electrically isolated from, and magnetically coupled to, the domain wall track;
input signals to the crossbar synapse array provided to the first ends of the domain wall tracks of the synapses;
electrical connections between the fixed ferromagnets of the synapses and the first ends of the domain wall tracks of the neurons; and,
electrical connections between the second ends of the domain wall tracks of the synapses and the free ferromagnets within the neurons.

2. The neural network of claim 1, wherein the fixed ferromagnets within the neurons are connected to a constant power supply voltage and the free ferromagnets within the neurons are connected to both the second ends of the domain wall tracks of the synapses and the first ends of crossbar synapses of another layer of a neural network.

3. The neural network of claim 1, wherein all synapses in the same row of the crossbar array are provided the same input to the first ends of their domain wall tracks.

4. The neural network of claim 1, wherein all synapses in the same column of the crossbar array are connected to the same neuron.

5. The neural network of claim 1, wherein firing of an artificial neuron causes current to flow through the domain wall track of at least one synapse, causing the domain wall to move.

6. The neural network of claim 1, wherein this process constitutes the unsupervised learning of information.

7. The neural network of claim 1, wherein the domain walls within the synapses move in response to the voltages and/or currents applied by input signals to the first ends of the synapse domain wall tracks relative to the firing signals provided by the neurons to the second ends of the synapse domain wall tracks.

8. The neural network of claim 1, wherein the motion of the domain walls within a synapse modifies the resistance of the magnetic tunnel junction and therefore the weight encoded by the synapse.

9. The neural network of claim 1, wherein a large input signal to a particular synapse simultaneous to or briefly preceding the firing of a neuron connected to that synapse causes the domain wall within that synapse to move such that the resistance of the magnetic tunnel junction within that synapse decreases.

10. The neural network of claim 1, wherein an absent or low input signal to a particular synapse simultaneous to or briefly preceding the firing of a neuron connected to that synapse causes the domain wall within that synapse to move such that the resistance of the magnetic tunnel junction within that synapse increases.

11. The neural network of claim 1, wherein the network is extended to multiple neural network layers.

12. A method of performing unsupervised learning within a neural network, the method comprising:
applying input currents and/or voltages as inputs to the neural network, wherein the neural network comprises:
a crossbar array of domain wall magnetic tunnel junction artificial synapses, each comprising a ferromagnetic domain wall track within which is a magnetic domain wall, wherein the domain wall track has a first fixed magnetization region at a first end and a second fixed magnetization region at a second end, and wherein the second fixed magnetization region has a magnetic direction opposite to the first fixed magnetization region; a magnetic tunnel junction between the first and second ends of the domain wall track, wherein the magnetic tunnel junction comprises a fixed ferromagnet; a tunnel barrier beneath the fixed ferromagnet; and the domain wall track beneath the tunnel barrier;
a plurality of domain wall magnetic tunnel junction artificial neurons, each comprising a ferromagnetic domain wall track within which is a magnetic domain wall, wherein the domain wall track has a first fixed magnetization region at a first end and a second fixed magnetization region at a second end, wherein the second fixed magnetization region has a magnetic direction opposite to the first fixed magnetization region, and wherein the domain wall track comprises an energy gradient between the first and second ends; a magnetic tunnel junction between the first and second ends of the domain wall track, wherein the magnetic tunnel junction comprises a fixed ferromagnet;
a tunnel barrier beneath the fixed ferromagnet;
a free ferromagnet beneath the tunnel barrier; and
an electrically insulating, magnetic coupling layer between the free ferromagnet and the domain wall track, wherein the free ferromagnet is electrically isolated from, and magnetically coupled to, the domain wall track;
input signals to the crossbar synapse array provided to the first ends of the domain wall tracks of the synapses;
connections between the fixed ferromagnets of the synapses and the first ends of the domain wall tracks of the neurons; and
connections between the second ends of the domain wall tracks of the synapses and the free ferromagnets within the neurons;
wherein the domain walls within the synapse domain wall tracks move in response to the voltages and/or currents applied by input signals to the first ends of the synapse domain wall tracks relative to the firing signals provided by the neurons to the second ends of the synapse domain wall tracks, resulting in unsupervised learning.

13. The method of claim 12, wherein the fixed ferromagnets within the neurons are connected to a constant power supply voltage and the free ferromagnets within the neurons are connected to both the second ends of the domain wall tracks of the synapses and the first ends of crossbar synapses of another layer of a neural network.

14. The method of claim 12, wherein all synapses in the same row of the crossbar array are provided the same input to the first ends of their domain wall tracks.

15. The method of claim 12, wherein all synapses in the same column of the crossbar array are connected to the same neuron.

16. The method of claim 12, wherein firing of an artificial neuron causes current to flow through the domain wall track of at least one synapse, causing the domain wall to move.

17. The method of claim 12, wherein the network is extended to multiple neural network layers.

18. The method of claim 12, wherein the motion of the domain walls within a synapse modifies the resistance of the magnetic tunnel junction and therefore the weight encoded by the synapse.

19. The method of claim 12, wherein a large input signal to a particular synapse simultaneous to or briefly preceding the firing of a neuron connected to that synapse causes the domain wall within that synapse to move such that the resistance of the magnetic tunnel junction within that synapse decreases.

20. The method of claim 12, wherein an absent or low input signal to a particular synapse simultaneous to or briefly preceding the firing of a neuron connected to that synapse causes the domain wall within that synapse to move such that the resistance of the magnetic tunnel junction within that synapse increases.

21. The method of claim 12, wherein the signal provided from the ferromagnets within the neurons to the second ends of the domain wall tracks of the synapses represents the backpropagation of information that enables learning and/or training.

* * * * *